(12) United States Patent
Wood et al.

(10) Patent No.: US 7,393,770 B2
(45) Date of Patent: Jul. 1, 2008

(54) BACKSIDE METHOD FOR FABRICATING SEMICONDUCTOR COMPONENTS WITH CONDUCTIVE INTERCONNECTS

(75) Inventors: Alan G. Wood, Boise, ID (US); William M. Hiatt, Eagle, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 338 days.

(21) Appl. No.: 11/133,085

(22) Filed: May 19, 2005

(65) Prior Publication Data

US 2006/0261446 A1 Nov. 23, 2006

(51) Int. Cl.
H01L 29/40 (2006.01)
H01L 23/02 (2006.01)
H01L 21/00 (2006.01)
H01L 21/76 (2006.01)
H01L 21/30 (2006.01)
H01L 21/44 (2006.01)

(52) U.S. Cl. .................... 438/598; 438/33; 438/68; 438/113; 438/160; 438/443; 438/458; 438/459; 438/460; 438/464; 438/667; 257/502; 257/520; 257/621; 257/686; 257/774; 257/777

(58) Field of Classification Search .................. None
See application file for complete search history.

(56) References Cited

U.S. PATENT DOCUMENTS

| | | | |
|---|---|---|---|
| 3,761,782 A * | 9/1973 | Youmans | 257/778 |
| 4,394,712 A | 7/1983 | Anthony | |
| 4,897,708 A * | 1/1990 | Clements | 257/690 |
| 5,229,647 A * | 7/1993 | Gnadinger | 257/785 |
| 5,432,999 A | 7/1995 | Capps | |
| 5,503,285 A * | 4/1996 | Warren | 216/2 |
| 5,649,981 A | 7/1997 | Arnold et al. | |
| 5,674,785 A | 10/1997 | Akram et al. | |
| 5,686,352 A | 11/1997 | Higgins, III | |
| 5,840,199 A * | 11/1998 | Warren | 216/2 |
| 5,950,070 A * | 9/1999 | Razon et al. | 438/113 |
| 6,043,564 A | 3/2000 | Brooks et al. | |
| 6,100,175 A | 8/2000 | Wood et al. | |

(Continued)

OTHER PUBLICATIONS

Leon Oboler, "Still at the Head of the Class", Chip Scale Review, internet article, Jul./Aug. 1999, pp. 1-7.

(Continued)

Primary Examiner—Carl Whitehead, Jr.
Assistant Examiner—James M Mitchell
(74) Attorney, Agent, or Firm—Stephen A. Gratton

(57) ABSTRACT

A backside method for fabricating a semiconductor component with a conductive interconnect includes the step of providing a semiconductor substrate having a circuit side, a backside, and a substrate contact on the circuit side. The method also includes the steps of forming a substrate opening from the backside to the substrate contact, and then bonding the conductive interconnect to an inner surface of the substrate contact. A system for performing the method includes the semiconductor substrate, a thinning system for thinning the semiconductor substrate, an etching system for forming the substrate opening, and a bonding system for bonding the conductive interconnect to the substrate contact. The semiconductor component can be used to form module components, underfilled components, stacked components, and image sensor semiconductor components.

23 Claims, 20 Drawing Sheets

U.S. PATENT DOCUMENTS

| | | |
|---|---|---|
| 6,235,554 B1 | 5/2001 | Akram et al. |
| 6,251,703 B1 * | 6/2001 | Van Campenhout et al. ... 438/106 |
| 6,326,689 B1 * | 12/2001 | Thomas ................ 257/734 |
| 6,368,896 B2 | 4/2002 | Farnworth et al. |
| 6,395,581 B1 | 5/2002 | Choi |
| 6,400,172 B1 | 6/2002 | Akram et al. |
| 6,435,200 B1 | 8/2002 | Langen |
| 6,444,576 B1 | 9/2002 | Kong |
| 6,451,624 B1 | 9/2002 | Farnworth et al. |
| 6,465,877 B1 | 10/2002 | Farnworth et al. |
| 6,494,221 B1 | 12/2002 | Sellmer et al. |
| 6,501,165 B1 | 12/2002 | Farnworth et al. |
| 6,569,762 B2 * | 5/2003 | Kong ................ 438/667 |
| 6,582,992 B2 | 6/2003 | Poo et al. |
| 6,601,888 B2 | 8/2003 | McIlwraith et al. |
| 6,611,052 B2 | 8/2003 | Poo et al. |
| 6,614,104 B2 | 9/2003 | Farnworth et al. |
| 6,740,960 B1 | 5/2004 | Farnworth et al. |
| 6,812,549 B2 * | 11/2004 | Umetsu et al. ........... 257/621 |
| 6,828,175 B2 | 12/2004 | Wood et al. |
| 6,833,612 B2 | 12/2004 | Kinsman |
| 6,833,613 B1 | 12/2004 | Akram et al. |
| 6,841,883 B1 | 1/2005 | Farnworth et al. |
| 6,848,177 B2 | 2/2005 | Swann et al. |
| 6,858,092 B2 | 2/2005 | Langen |
| 6,881,648 B2 | 4/2005 | Chen et al. |
| 6,936,913 B2 * | 8/2005 | Akerling et al. ........... 257/686 |
| 7,119,001 B2 * | 10/2006 | Kang ................ 438/598 |
| 7,180,149 B2 * | 2/2007 | Yamamoto et al. ......... 257/434 |
| 2002/0017710 A1 * | 2/2002 | Kurashima et al. ......... 257/686 |
| 2003/0230805 A1 | 12/2003 | Noma et al. |
| 2004/0235270 A1 * | 11/2004 | Noma et al. ............. 438/460 |
| 2004/0256734 A1 * | 12/2004 | Farnworth et al. ......... 257/777 |
| 2005/0029650 A1 * | 2/2005 | Wood et al. ............. 257/698 |
| 2005/0082654 A1 * | 4/2005 | Humpston et al. .......... 257/678 |
| 2005/0205951 A1 * | 9/2005 | Eskridge ................ 257/416 |
| 2006/0163679 A1 * | 7/2006 | LaFond et al. ........... 257/414 |
| 2007/0138498 A1 * | 6/2007 | Zilber et al. ............. 257/99 |
| 2008/0038868 A1 * | 2/2008 | Leib .................... 438/107 |

OTHER PUBLICATIONS

IBM and SUSS announce semiconductor technology agreement, internet article, Sep. 13, 2004, pp. 1-2.

IBM Research & IBM Systems and Technology Group, C4NP Technology for lead-free wafer bumping, internet article, Sep. 2004, pp. 1-13.

* cited by examiner

BACKSIDE METHOD FOR FABRICATING SEMICONDUCTOR COMPONENTS WITH CONDUCTIVE INTERCONNECTS

FIELD OF THE INVENTION

This invention relates generally to semiconductor packaging, and particularly to a backside method and system for fabricating semiconductor components with conductive interconnects. This invention also relates to semiconductor components having conductive interconnects fabricated using the method and the system.

BACKGROUND OF THE INVENTION

A semiconductor component includes a semiconductor substrate containing various semiconductor devices and integrated circuits. Typically, the semiconductor substrate is in the form of a semiconductor die, that has been singulated from a semiconductor wafer. For example, a chip scale semiconductor component includes a semiconductor die provided with support and protective elements, and a signal transmission system. Semiconductor components can also include multiple semiconductor substrates in a stacked or planar array. For example, a system in a package (SIP) can include multiple semiconductor dice with different electronic configurations packaged in a plastic body (e.g., an application specific die+a memory die).

Semiconductor components include different types of interconnects for implementing different signal transmission system. Interconnects can be formed "on" the semiconductor substrate for transmitting signals in x and y directions. For example, surface interconnects, such as conductors "on" a circuit side of the semiconductor component, can be used to electrically connect the integrated circuits with terminal contacts on the circuit side. Interconnects can also be formed "external" to the semiconductor substrate for transmitting signals in x, y and z directions. For example, wire interconnects, such as wires bonded to the semiconductor substrate, can be used to electrically connect the integrated circuits to "external" terminal contacts on a support substrate for the component.

In fabricating semiconductor components, it is sometimes necessary to provide interconnects which transmit signals from a circuit side of a semiconductor substrate to the backside of the semiconductor substrate. Interconnects which extend through the semiconductor substrate from the circuit side to the backside are sometimes referred to as "through" interconnects. Typically through interconnects comprise metal filled vias formed "in" the semiconductor substrate, which are configured to electrically connect the integrated circuits on the circuit side to elements on a backside of the semiconductor substrate.

As semiconductor components become smaller and have higher input/output configurations, semiconductor manufacturers must fabricate through interconnects with increasingly smaller sizes and pitches, but without compromising the performance and reliability of the signal transmission system. In addition, it is preferable for through interconnects to be capable of volume manufacture using equipment and techniques that are known in the art.

The present invention is directed to a method and system for fabricating semiconductor components with conductive interconnects using backside processes. In addition, the present invention is directed to semiconductor components, including chip scale components, wafer scale components, and multi dice components, having conductive interconnects.

SUMMARY OF THE INVENTION

In accordance with the present invention, a backside method and a system are provided for fabricating semiconductor components with conductive interconnects. Also provided are improved semiconductor components having backside fabricated conductive interconnects.

The method includes the step of providing a semiconductor substrate having a circuit side, a backside, and at least one substrate contact on the circuit side. The method also includes the steps of thinning the backside of the semiconductor substrate, forming a substrate opening in the semiconductor substrate from the backside to an inner surface of the substrate contact, and then bonding a conductive interconnect to the inner surface of the substrate contact.

Advantageously, the steps of the method can be performed primarily from the backside of the semiconductor substrate. This allows the circuit side of the semiconductor substrate to remain protected during the fabrication process. The thinning step can be performed using a chemical mechanical planarization (CMP) process, an etching process, or a combination of these processes. The substrate opening forming step can be performed using a reactive ion etching process (RIE), a wet etching process, a laser machining process, a sawing process or a combination of these processes. The bonding step can be performed using a wire bonding process, such as ultrasonic wire bonding, thermosonic wire bonding or thermocompression wire bonding. Alternately, the bonding step can be performed using a tape automated bonding (TAB) process, such as single point bonding, gang bonding, thermocompression bonding or thermosonic, bonding. As another alternative, the bonding step can be performed using a conductive polymer bonding process. As yet another alternative, the bonding step can be performed using a bumping process, such as thermal reflow, laser solder ball bumping, bumping using a dispensing mechanism, or bumping by transfer from a bump template.

With a wire bonding process, the conductive interconnect includes a wire in the substrate opening, and a bonded connection between the wire and the inner surface of the substrate contact. With a tape automated bonding process, the conductive interconnect includes a flex circuit having a flex circuit conductor on a polymer substrate, and a bonded connection between the flex circuit conductor and the inner surface of the substrate contact. The flex circuit can also include terminal contacts on the polymer substrate in electrical communication with the flex circuit conductors. With a conductive polymer bonding process, the conductive interconnect includes a conductive polymer layer, which forms bonded connections between a flex circuit conductor, and the inner surface of the substrate contact. With a bumping process, the conductive interconnect includes a solder bump in the substrate opening bonded to the inner surface of the substrate contact.

The system includes the semiconductor substrate with the substrate contact, a thinning system for thinning the semiconductor substrate from the backside, an etching system for forming the substrate opening to the inner surface of the substrate contact, and a bonding system for forming the bonded connection between the conductive interconnect and the inner surface of the substrate contact.

The component includes the semiconductor substrate having at least one conductive interconnect on the backside thereof bonded to the inner surface of the substrate contact. A stacked semiconductor component includes multiple semiconductor components in a stacked array having bonded connections between conductive interconnects on adjacent components. An image sensor semiconductor component includes a semiconductor substrate having light detecting elements on the circuit side, and conductive interconnects on the backside.

DETAILED DESCRIPTION OF THE PREFERRED EMBODIMENTS

As used herein, "semiconductor component" means an electronic element that includes a semiconductor die, or makes electrical connections with a semiconductor die. "Wafer-level" means a process conducted on an element, such as a semiconductor wafer, containing multiple components. "Die level" means a process conducted on a singulated element such as a singulated semiconductor die or package. "Chip scale" means a semiconductor component having an outline about the same size as the outline of a semiconductor die.

Referring to FIGS. 1A-1G, and 2A-2E, steps in the method of the invention are illustrated. In the illustrative embodiment, the method is performed at the wafer level on a semiconductor wafer 10 containing a plurality of semiconductor substrates 12. The semiconductor wafer 10 can comprise a semiconductor material, such as silicon or gallium arsenide. In addition, the semiconductor substrates 12 can be in the form of semiconductor dice having a desired electrical configuration, such as memory, application specific, image sensing, or imaging.

Figure 1A:
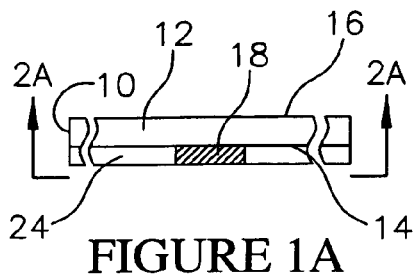
FIGS. 1A-1G are schematic cross sectional views illustrating steps in a method for fabricating a semiconductor component.
Figure 2A:
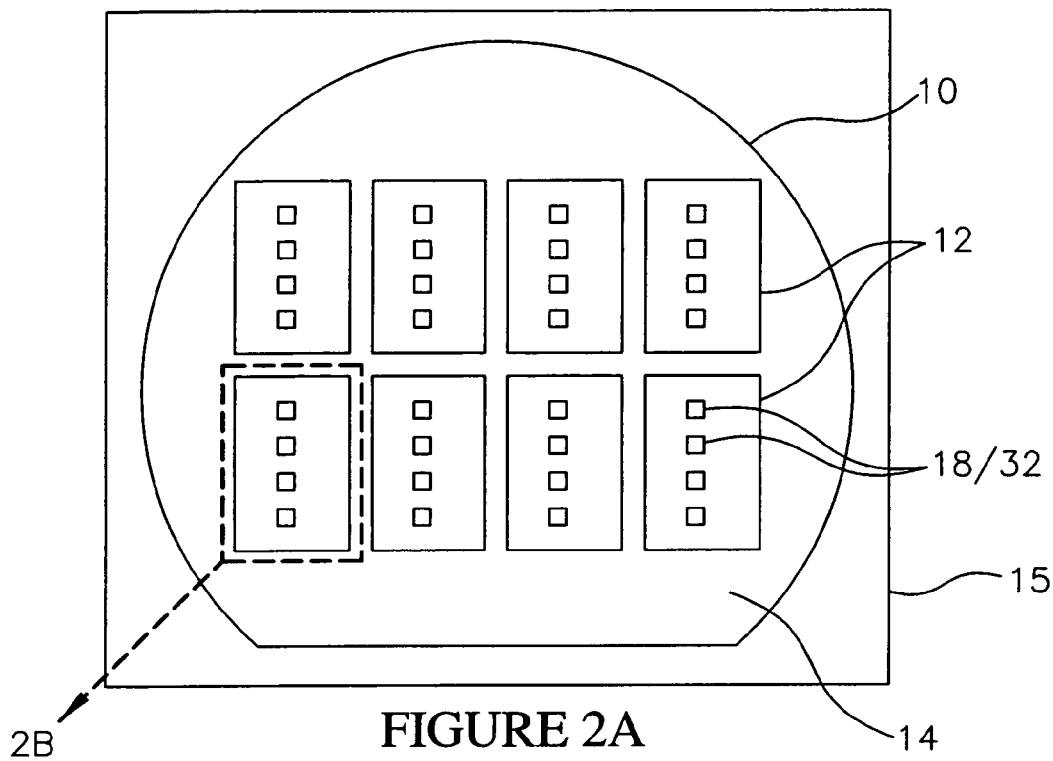
FIG. 2A is a schematic view taken along line 2A-2A of FIG. 1A.
Figure 2B:
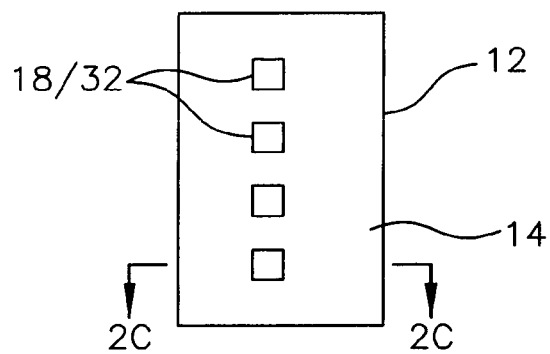
FIG. 2B is an enlarged schematic view taken along line 2B-2B of FIG. 2A.

As shown in FIG. 1A, a semiconductor substrate 12 on the wafer 10 includes a circuit side 14 ("first side" in some of the claims), and a backside 16 ("second side" in some of the claims). In addition, the semiconductor substrate 12 includes a plurality of substrate contacts 18 on the circuit side 14, which in the illustrative embodiment comprise the device bond pads. The substrate contacts 18 can comprise a highly conductive, bondable metal, such as aluminum or copper. In addition, the substrate contacts 18 can comprise a base layer of a metal such as aluminum or copper plated with a bondable metal such as Ni, Au, solder or a solder wettable metal. As shown in FIG. 2A, the semiconductor substrate 12 is illustrated with five substrate contacts 18 arranged in a single row along a center line thereof. However, in actual practice the semiconductor substrate 12 can include tens of substrate contacts 18 arranged in a desired configuration, such as a center array, an edge array or an area array.

Figure 2C:
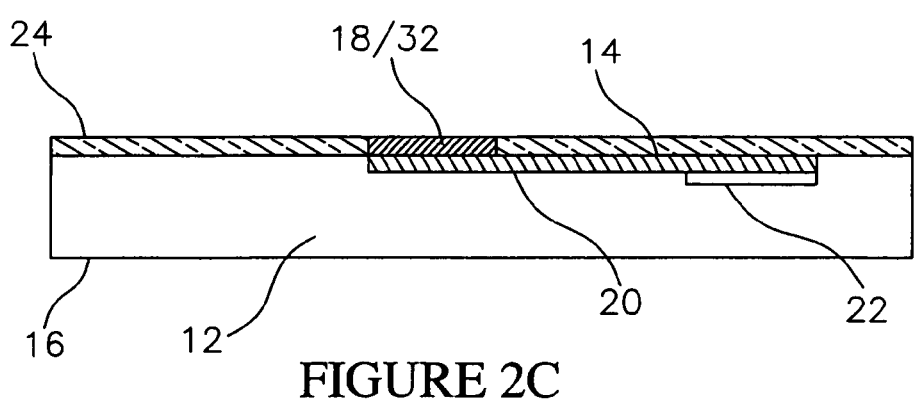
FIG. 2C is an enlarged schematic cross sectional view taken along line 2C-2C of FIG. 2B.

As shown in FIG. 2C, the substrate contacts 18 are in electrical communication with internal conductors 20 on the circuit side 14 of the semiconductor substrate 12. In addition, the internal conductors 20 are in electrical communication with integrated circuits 22 in the semiconductor substrate 12. Further, a die passivation layer 24 on the circuit side 14 protects the internal conductors 20 and the integrated circuits 22. The die passivation layer 24 comprises an electrically insulating material, such as BPSG (borophosphosilicate glass), a polymer or an oxide. All of these elements of the semiconductor substrate 12 including the internal conductors 20, the integrated circuits 22, and the passivation layer 24, can be formed using well known semiconductor fabrication processes.

Figure 1B:
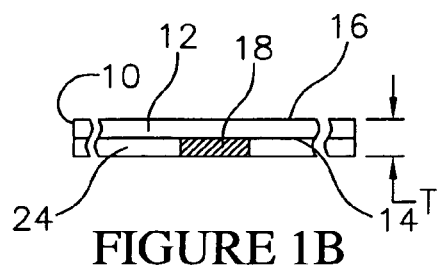

Initially, as shown in FIG. 1B, the semiconductor wafer 10 and the semiconductor substrate 12 are thinned from the backside 16 to a selected thickness T. The backside thinning step removes semiconductor material from the semiconductor wafer 10 and the semiconductor substrate 12. A representative range for the thickness T can be from about 10 µm to 725 µm. During the thinning step, and in subsequent steps to follow, the semiconductor wafer 10 can be mounted in a temporary carrier 15 (FIG. 2A). For example, temporary carriers made of glass can be fused by heat and adhesives to the semiconductor wafer 10 to protect the circuit side 14 of the semiconductor substrate 12. Suitable, temporary carriers are manufactured by 3-M Corporation of St. Paul, Minn., and others as well. Because the steps of the method are performed primarily from the backside 16 of the semiconductor wafer 10, the circuit side 14 can remain face down and protected by the temporary carrier 15 (FIG. 2A). As another alternative, for some steps of the method, the circuit side 14 can be protected by a removable material such as a tape or mask material applied to the semiconductor wafer 10.

The backside thinning step can be performed using a chemical mechanical planarization (CMP) apparatus. One suitable CMP apparatus is manufactured by "ACCRETECH" of Tokyo, Japan, and is designated a model no. "PG300RM". Suitable CMP apparatus are also commercially available from Westech, SEZ, Plasma Polishing Systems, TRUSI and other manufacturers. The backside thinning step can also be performed using an etching process, such as a wet etching process, a dry etching process or a plasma etching process. As another alternative, a combination of planarization and etching can be performed. For example, a mechanical grinder can be used to remove the bulk of the material, followed by etching to remove grind damage. U.S. Pat. No. 6,841,883 B1, entitled "Multi-Dice Chip Scale Semiconductor Components And Wafer Level Methods Of Fabrication", which is incorporated herein by reference, further describes processes and equipment for performing the backside thinning step.

Figure 1C:
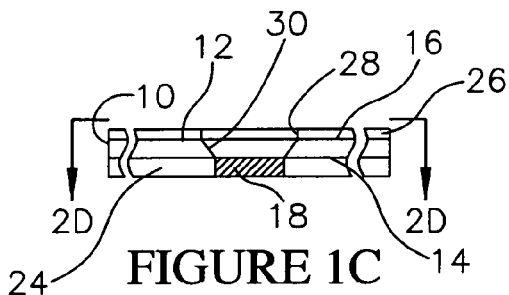
Figure 1D:
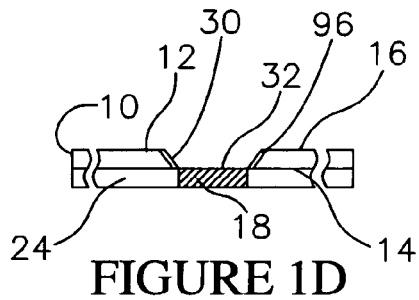

Next, as shown in FIGS. 1C and 1D, a mask 26 having mask openings 28 is formed on the backside 16 of the wafer 10, and an opening forming step is performed. During the opening forming step, substrate openings 30 are formed through the semiconductor substrate 12 to the substrate contacts 18. In addition, the opening forming step is performed such that the substrate contacts 18 maintain their electrical communication with the internal conductors 20 (FIG. 2C) and the integrated circuits 22 (FIG. 2C) in the semiconductor substrate 12.

The mask 26 (FIG. 1C) can comprise a material such as silicon nitride or resist, deposited to a desired thickness, and then patterned with the mask openings 28, using a suitable process. For example, the mask 26 can be formed using photo patterning equipment configured to form the mask openings 28 with a required size and shape, and in precise alignment with the substrate contacts 18. During formation of the mask 26, the wafer 10 can be held in the temporary carrier 15, or an equivalent temporary carrier configured for mask formation.

Figure 2D:
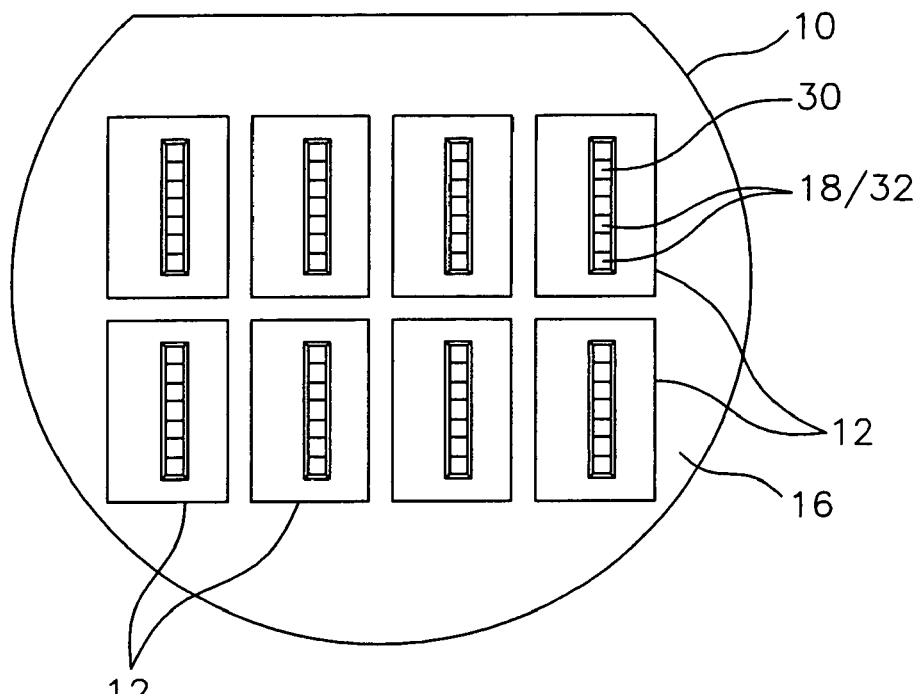
FIG. 2D is a schematic view taken along line 2D-2D of FIG. 1C.
Figure 2E:
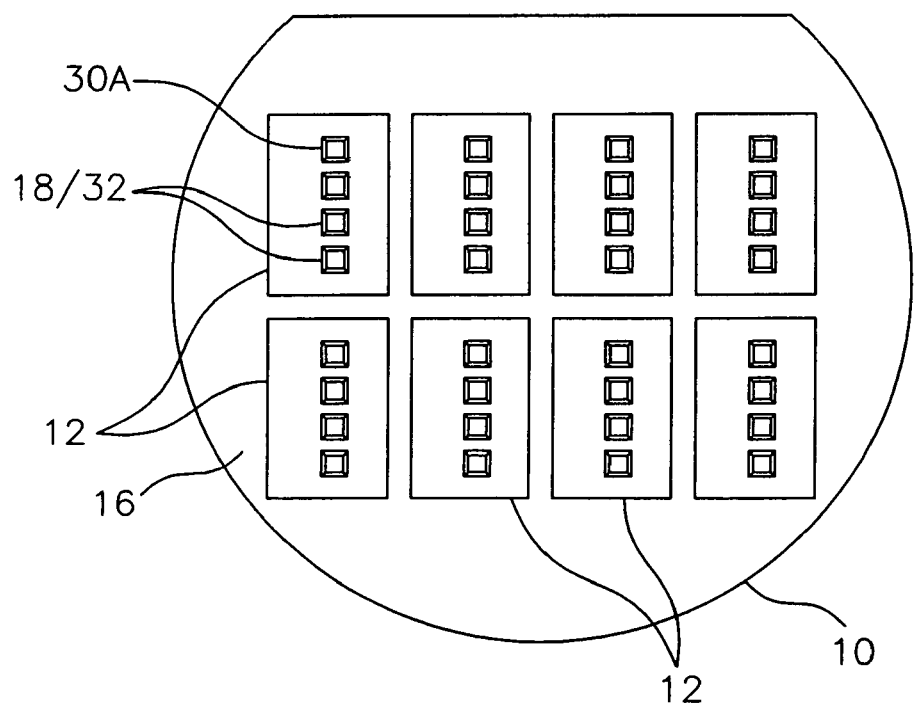
FIG. 2E is a schematic view equivalent to FIG. 2D illustrating an alternate embodiment of the method.

As shown in FIG. 2D, the substrate openings 30 can comprise elongated rectangular trenches that align with, and encircle multiple substrate contacts 18. Alternately, as shown in FIG. 2E, alternate embodiment substrate openings 30A can comprise separate pockets having a desired peripheral outline, each of which aligns with only one substrate contact 18.

The opening forming step can be performed using an etching process such as a dry etching process or a wet etching process. With the wafer 10 and the substrate 12 comprising silicon, one suitable dry etching process is reactive ion etching (RIE). Reactive ion etching (RIE) can be performed in a reactor with a suitable etch gas, such as $CF_4$, $SF_6$, $Cl_2$ or $CCl_2F_2$. Reactive ion etching (RIE) is sometimes referred to as "BOSCH" etching, after the German company Robert Bosch, which developed the original process. The opening forming step can also be performed using an anisotropic or isotropic wet etching process. For example, with the wafer 10 and the substrate 12 comprising silicon, one suitable wet etchant comprises a solution of KOH. With a KOH etchant, an anisotropic etch process is performed, and the substrate openings 30 (FIG. 1D) are pyramidal shaped, with sloped sidewalls oriented at an angle of about 55° with the horizontal. In the drawings, the substrate openings 30 are illustrated with sloped sidewalls, such as would occur with an anisotropic etch process. However, depending on the etching process, the substrate openings 30 can also have perpendicular or radiused sidewalls, such as would occur with a reactive ion etching (RIE) process. Rather than etching, the opening forming step can be performed using a mechanical process, such as sawing with a blade, or drilling with a laser. Opening forming steps are also described in previously incorporated U.S. Pat. No. 6,841,883 B1.

As with the thinning step the opening forming step is performed from the backside 16 of the semiconductor substrate 12, such that the circuit side 14 can remain protected. In addition, the opening forming step can be performed with the wafer 10 held in the temporary carrier 15, or an equivalent temporary carrier configured for dry or wet etching. Further, the opening forming step can be controlled to endpoint the substrate openings 30 (FIG. 1D) on the inner surfaces 32 (FIG. 1D) of the substrate contacts 18 (FIG. 1D). For simplicity in FIGS. 1C-1G, the substrate openings 30 are illustrated as being about the same width as the substrate contacts 18. However, in actual practice the substrate openings 30 can be smaller in width than the substrate contacts 18. In any case, the substrate openings 30 are formed such that the electrical connections between the substrate contacts 18 and the internal conductors 20 (FIG. 2C) are maintained.

Figure 1E:
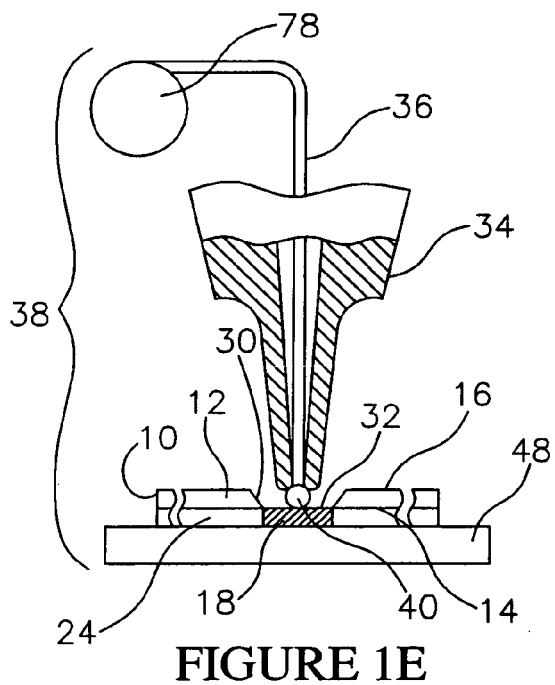

As shown in FIG. 1E, the substrate openings 30 (FIG. 1E) can be large enough to allow access for a bonding capillary 34 (FIG. 1E) to the inner surfaces 32 of the substrate contacts 18 (FIG. 1E). For example, if the bonding capillary 34 (FIG. 1E) has a tip width of 65 µm, the substrate openings 30 can have a width of greater than 65 µm. Alternately, the substrate openings 30 can have a smaller width than the bonding capillary 34 (FIG. 1E), provided that bonds can be made on the inner surfaces 32 of the substrate contacts 18 (FIG. 1E). For example, additional layers on the inner surfaces 32 can provide bonding surfaces which project from the substrate openings 30. As another example, the bonding capillary 34 (FIG. 1E) can be configured to form a bondable free air ball which has a diameter that is less than a width of the substrate openings 30, but greater than a depth of the openings 30. In this case, the bonding capillary 34 (FIG. 1E) could be larger than the substrate openings 30, while still being able to make bonded connections on the inner surfaces 32 of the substrate contacts 18 (FIG. 1E).

As an alternative to forming the substrate openings 30 (FIG. 1D) by wet etching, a laser machining process can be used. The laser machining process can also include a wet etching step to remove contaminants and slag. In addition, the laser machining process would be particularly suited to forming the pocket sized substrate openings 30A (FIG. 2E). One suitable laser system for performing the laser machining process is manufactured by XSIL LTD of Dublin, Ireland, and is designated a Model No. XISE 200.

As shown in FIG. 1D, the substrate openings 30 (FIG. 1D) can also be electrically insulated from the remainder of the semiconductor substrate 12 by forming insulating layers 96 (FIG. 1D) on the inside surfaces of the substrate openings 30. For simplicity in FIGS. 1D-1G, the insulating layers 96 (FIG. 1D) are only illustrated in FIG. 1D. The insulating layers 96 can comprise a polymer, such as polyimide or parylene, deposited using a suitable process, such as vapor deposition, capillary injection or screen-printing. Alternately, the insulating layers 96 (FIG. 1D) can comprise a deposited oxide layer, such as a low temperature deposited oxide. As another alternative, the insulating layers 96 can comprise a grown oxide layer, such as silicon dioxide formed by oxidation of silicon. In FIG. 1D, the insulating layers 96 are shown only in the openings 30. However, the insulating layers 96 can also cover the backside 16 of the semiconductor substrate 12. In this case, a blanket deposited insulating layer can be formed on the backside 16 and in the substrate openings 30, and a spacer etch can be used to remove the insulating layer from the inner surface 32 of the substrate contact 18. Previously incorporated U.S. Pat. No. 6,841,883 B1, further describes techniques for forming insulating layers in the substrate openings 30 and on the backside 16 of the semiconductor substrate 12.

Figure 18A:
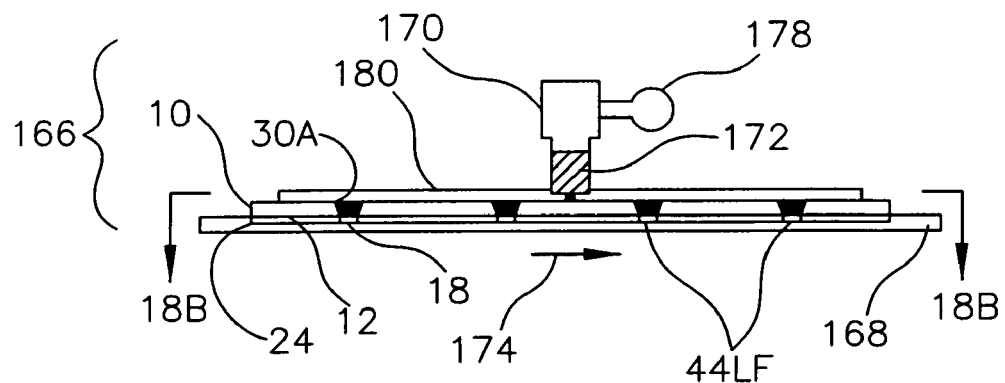
FIGS. 18A and 18B are schematic views of an alternate embodiment dispensing bumping system for the system of FIG. 16, with 18B being a cross sectional view taken along section line 18B-18B of FIG. 18A.
Figure 19:
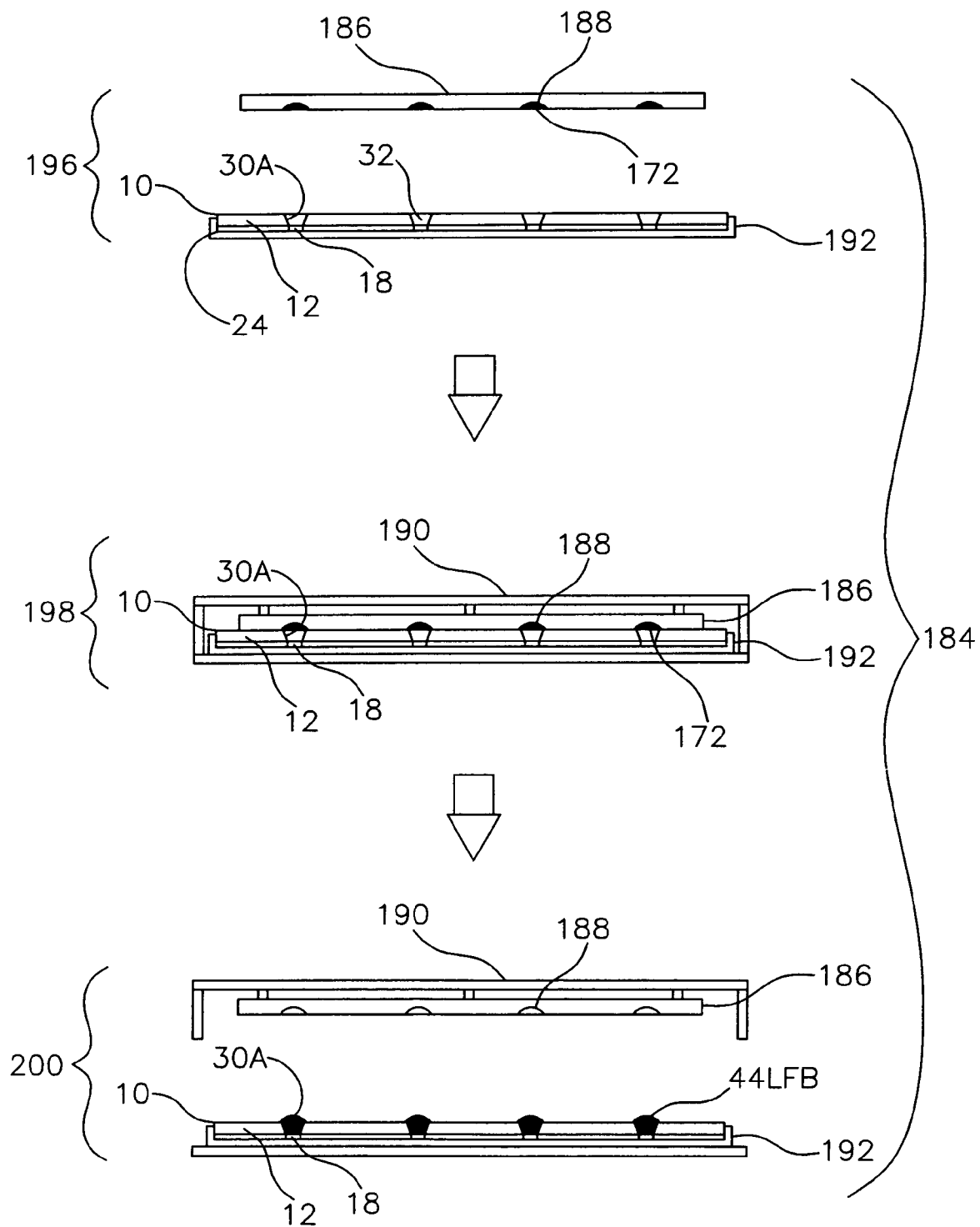
FIG. 19 is a schematic view of an alternate embodiment template transfer bumping system for the system of FIG. 16.

Next, as shown in FIG. 1E, a bonding step is performed using the bonding capillary 34 and a wire bonder 38. In the embodiment illustrated in FIG. 1E, the bonding step comprises a ball bonding process. However, the bonding step can also comprise a stud bumping process, or a wedge bonding process, such as a gold or aluminum wedge bonding process. Alternately, as will be further explained, the bonding step can comprise a tape automated bonding (TAB) process, such as single point TAB bonding, gang bonding or ribbon bonding. As another alternative, the bonding step can comprise a bumping process, such as reflow bonding of solder balls to the inner surfaces 32 of the substrate contacts 18. Another bumping process can comprise the formation of solder bumps on the inner surfaces 32 of the substrate contacts 18 using a laser solder ball bumper. Another bumping process can comprise the transfer of lead free bumps directly from a dispensing mechanism 170 (FIG. 18A), or by transfer from a bump template 186 (FIG. 19).

For performing the bonding step of FIG. 1E, the bonding capillary 34 and the wire bonder 38 can be configured to perform an ultra fine pitch (e.g., <65 µm) wire bonding process. Suitable bonding capillaries and wire bonders are manufactured by SPT (Small Precision Tools) of Petaluma, Calif. One suitable bonding capillary is designated as a molded slim line bottleneck (SBN) capillary. Kulicke & Soffa Industries Inc. of Willow Grove, Pa. also manufactures suitable bonding capillaries and wire bonders. For example, a model "8098" large area ball bonder manufactured by Kulicke & Soffa has a total bond placement accuracy of about +/−5 µm at pitches down to about 65 µm. A suitable stud bumper for performing the bonding step is a "WAFER PRO PLUS" high speed large area stud bumper manufactured by Kulicke & Soffa Industries, Inc. Wire bonding systems are also available from ESEC (USA), Inc., Phoenix, Ariz.; Palomar Technologies, Vista, Calif.; Shinkawa USA, Inc., Santa Clara, Calif.; ASM from Products Inc., San Jose, Calif.; Kaijo from Texmac Inc., Santa Clara, Calif.; and Muhibauer High Tech, Newport News, Va.

As shown in FIG. 1E, the bonding capillary 34 can be movable in x, y and z directions responsive to signals from a controller (not shown). In the illustrative embodiment, the bonding capillary 34 (FIG. 1E) is configured to bond a wire 36 having a diameter of from about 18 µm to about 150 µm to the inners surfaces 32 of the substrate contacts 18. The wire 36 can comprise a conventional wire material used in semiconductor packaging, such as gold, gold alloys, copper, copper alloys, silver, silver alloys, aluminum, aluminum-silicon alloys, and aluminum-magnesium alloys. Further, the wire 36 can comprise a metal, or a metal alloy, that does not contain reductions of hazardous substances (ROHS), such as lead. Exemplary ROHS free metals include gold and copper.

The wire bonder 38 (FIG. 1E) can also include a wire feed mechanism 78 (FIG. 1E) configured to feed the wire 36 through the bonding capillary 34. The wire feed mechanism 78 can comprise a standard wire feed mechanism, such as one incorporated into the above described wire bonders. For example, the wire feed mechanism 78 can comprise wire clamps, a mechanical wire feeder mechanism, a roller feed mechanism, or a linear motion clamp and feed mechanism.

The wire bonder 38 (FIG. 1E) can also include an alignment system (not shown) configured to align the bonding capillary 34 with the substrate contact 18. In addition, the wire bonder 38 (FIG. 1E) can include a work holder 48 configured to support the semiconductor substrate 12 and the substrate contact 18 during the bonding step. As with the previous steps, the wafer 10 can be held in the temporary carrier 15 (FIG. 2A) during the bonding step. For forming a ball bond as shown, the wire bonder 38 (FIG. 1E) can also include an element such as an electronic flame off (EFO) wand (not shown) configured to form a ball 40 (FIG. 1E) on the end of the wire 36. In addition, the bonding capillary 34 in combination with the wire feed mechanism 78 can be configured to capture the ball 40, and to press the ball 40 against the inside surface 32 of the substrate contact 18 to form a bonded connection 42 (FIG. 1F) between the wire 36 and the substrate contact 18. The bonding capillary 34 can also be configured to apply heat and ultrasonic energy to the ball 40, and to the substrate contact 18. As will be further explained, as an alternative to ball bonding, the bonding capillary 34 can be configured to form a wedge bond.

Figure 1F:
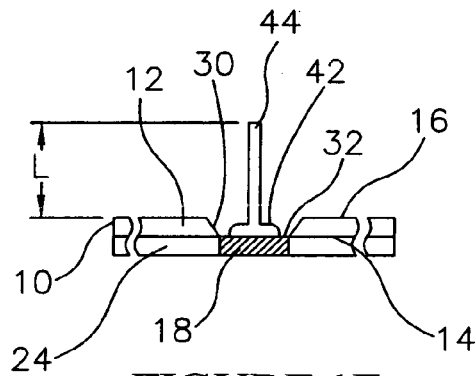

As shown in FIG. 1F, the bonding capillary 34 in combination with the wire feed mechanism 78 can be configured to perform a severing step in which the wire 36 is severed to a selected length L. The severing step forms a conductive interconnect 44 on the inside surface 32 of the substrate contact 18 and in the substrate opening 30. In addition, parameters of the bonding step can be controlled such that the conductive interconnect 44 projects from the backside 16 of the semiconductor substrate 12 with the length L. A representative value for the length L can be from about 50 µm to 1000 µm.

Figure 1G:
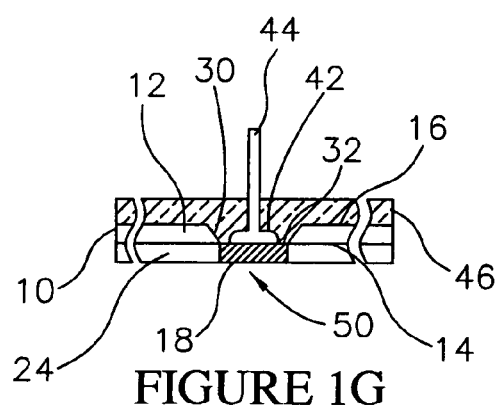

Next, as shown in FIG. 1G, an encapsulating step can be performed in which a dielectric encapsulant 46 is formed on the backside 16 of the semiconductor substrate 12. The dielectric encapsulant 46 is configured to protect and rigidify the conductive interconnect 44, and the bonded connection 42 between the conductive interconnect 44 and the substrate contact 18. The dielectric encapsulant 46 can comprise a curable polymer such as polyimide or parylene, deposited using a suitable process, such as spin on, nozzle deposition, or vapor deposition. In addition, although the dielectric encapsulant 46 is illustrated as a single layer of material covering the backside 16, the dielectric encapsulant 46 can comprise multiple layers of material. As another alternative, the dielectric encapsulant 46 can comprise separately dispensed polymer donuts formed in each substrate opening 30 to individually support each conductive interconnect 44.

Following the dielectric encapsulant 46 (FIG. 1G) forming step, a singulating step, such as sawing, scribing, liquid jetting, or laser cutting through a liquid, can be performed to singulate a chip scale semiconductor component 50 (FIG. 1G) from the wafer 10. Alternately, a wafer sized component can be provided which contains multiple unsingulated semiconductor substrates 12.

As shown in FIG. 1G, the completed semiconductor component 50 includes the semiconductor substrate 12 having the conductive interconnect 44 projecting from the backside 16 thereof with the length L. In addition, the semiconductor component 50 includes the dielectric encapsulant 46, supporting and protecting the conductive interconnect 44 and the bonded connection 42 on the inner surface 32 of the substrate contact 18. As will be further explained, the conductive interconnect 44 can be used as a terminal pin contact for mounting the semiconductor component 50 to another semiconductor component, or to another substrate, such as a flex circuit, or a printed circuit board. In addition, multiple conductive interconnects 44 can be arranged in a dense area array, such as a pin grid array (PGA). As will be further explained, the conductive interconnects 44 can also be used to interconnect multiple semiconductor components having conductive interconnects 44 in stacked assemblies.

Figure 3A:
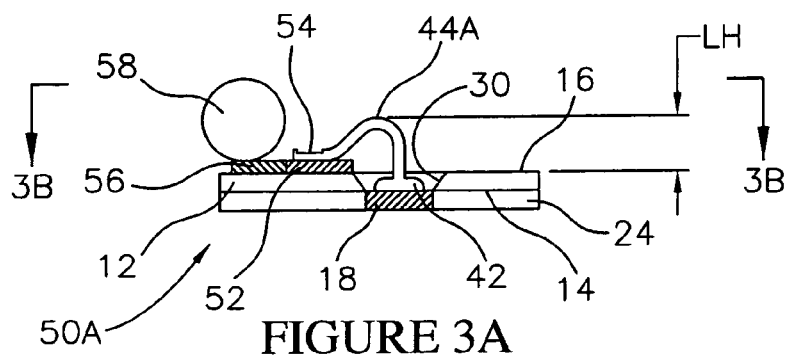
FIG. 3A is a schematic cross sectional view of an alternate embodiment semiconductor component.
Figure 3B:
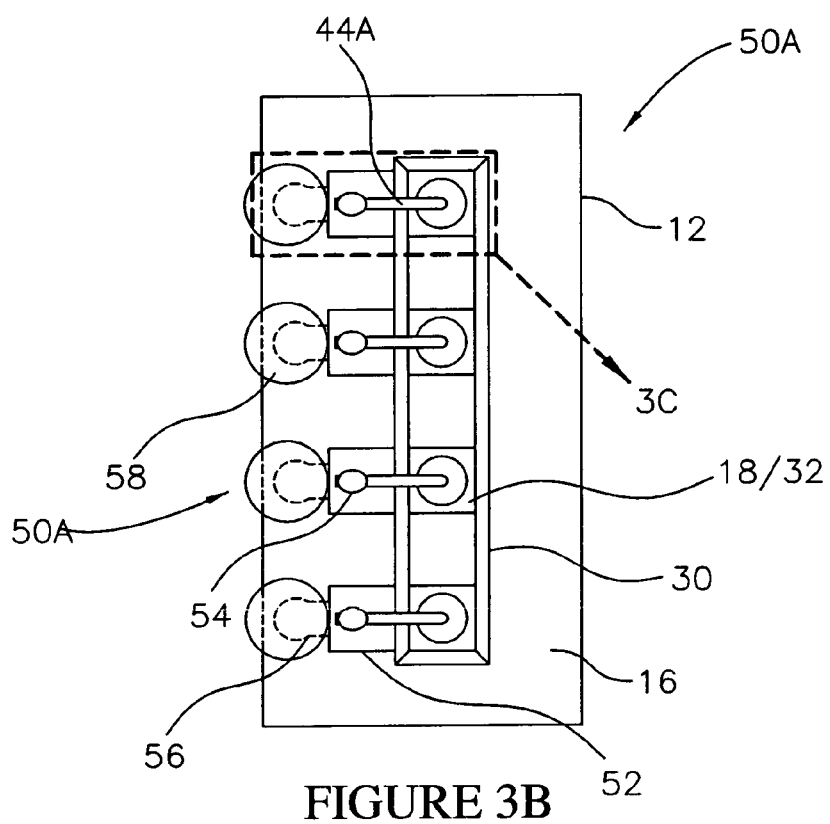
FIG. 3B is a view taken along line 3B-3B of FIG. 3A.
Figure 3C:
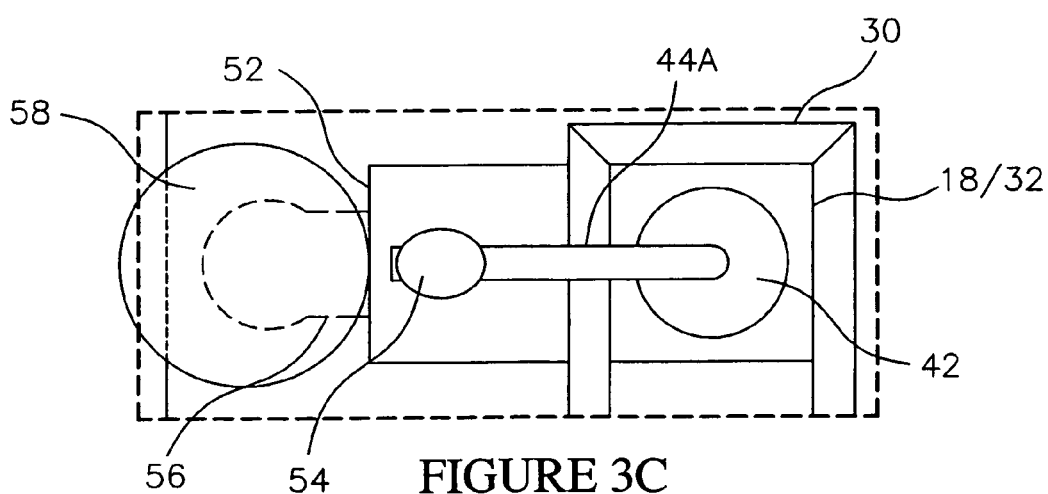
FIG. 3C is an enlarged view taken along line 3C of FIG. 3B.

Referring to FIGS. 3A-3C, an alternate embodiment semiconductor component 50A having alternate embodiment conductive interconnects 44A is illustrated. In this embodiment, the semiconductor substrate 12 includes a plurality of backside contacts 52 located on the backside 16 thereof. For example, each substrate contact 18 can include an associated backside contact 52. The backside contacts 52 can be formed using a suitable subtractive or additive metallization process.

The conductive interconnects 44A (FIG. 3A) include the bonded connections 42 with the substrate contacts 18, formed substantially as previously described and shown in FIGS. 1E and 1F. However, the conductive interconnects 44A (FIG. 3A) also include second bonded connections 54 with the backside contacts 52. As with the bonded connections 42, the second bonded connections 54 can be formed using the bonding capillary 34 (FIG. 1E) and the wire bonder 38 (FIG. 1E). However, in this case the second bonded connections 54 comprise "wedge" bonds rather than "ball" bonds. Wedge bonds are sometimes referred to as "stitch bonds".

The semiconductor component 50A also includes backside conductors 56 (FIG. 3B) and terminal contacts 58 (FIG. 3B) in electrical communication with the backside contacts 52 and the conductive interconnects 44A. The backside conductors 56 can be formed using a same metallization process as for the backside contacts 52. The terminal contacts 58 can comprise metal, solder, or conductive polymer balls, bumps or pins, formed using a metallization process, a stud bumping process or a ball bonding process. In addition, the terminal contacts 58 can be formed in an area array, such as a ball grid array, a pin grid array, an edge array or a center array.

The terminal contacts 58 preferably have an outside diameter that is larger than a loop height LH of the conductive interconnects 44A. This prevents shorting by contact of the conductive interconnects 44A with another component or another substrate, when the terminal contacts 58 are used for flip chip bonding structures. For example, the terminal contacts 58 can comprise balls having a selected diameter (e.g., 200 µm), and the conductive interconnects 44A can have a selected loop height LH (e.g., 100 µm). A representative range for the diameter of the terminal contacts 58 can be from 60-500 µm. A representative range for the loop height LH can be from 15-400 µm.

Figure 3D:
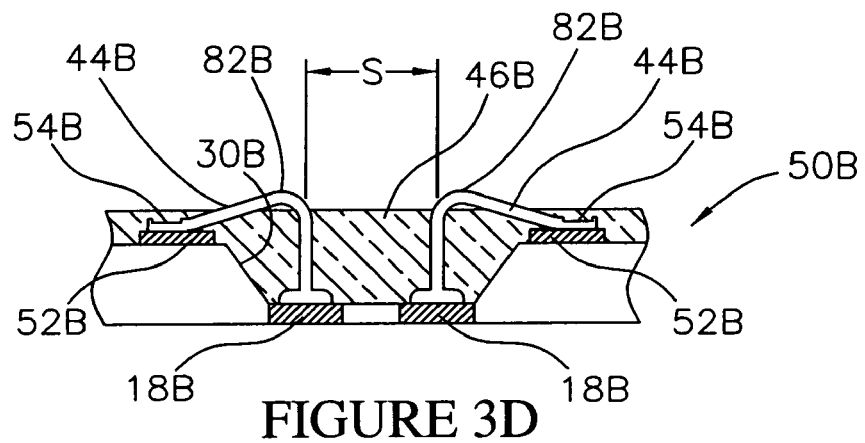
FIG. 3D is a schematic cross sectional view of an alternate embodiment semiconductor component.

Referring to FIG. 3D, an alternate embodiment semiconductor component 50B includes a substrate opening 30B sized and shaped to encompass side by side substrate contacts 18B. In addition, conductive interconnects 44B are bonded to the substrate contacts 18B and to backside contacts 52B, substantially as shown and described for the conductive interconnects 44A in FIGS. 3A and 3B. The substrate opening 30B can be formed using an etching process, substantially as previously described for the substrate opening 30 (FIG. 1D). In addition, the substrate contacts 18B, and the conductive interconnects 44B as well, can have a spacing S as small as about 25 µm, using the previously described bonding capillary 34 (FIG. 1E). The semiconductor component 50B also includes a dielectric encapsulant 46B, which substantially encapsulates the conductive interconnects 44B, while leaving loop portions 82B exposed for making outside electrical connections.

Figure 3E:
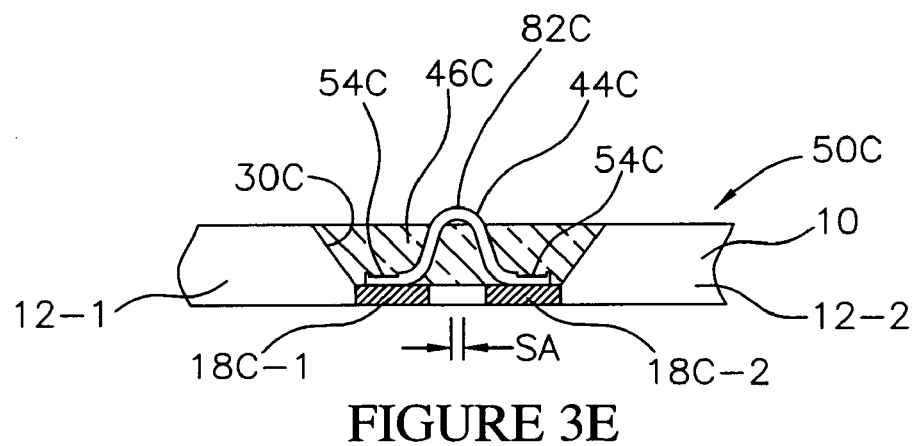
FIGS. 3E and 3F are schematic cross sectional views of an alternate embodiment semiconductor component.
Figure 3F:
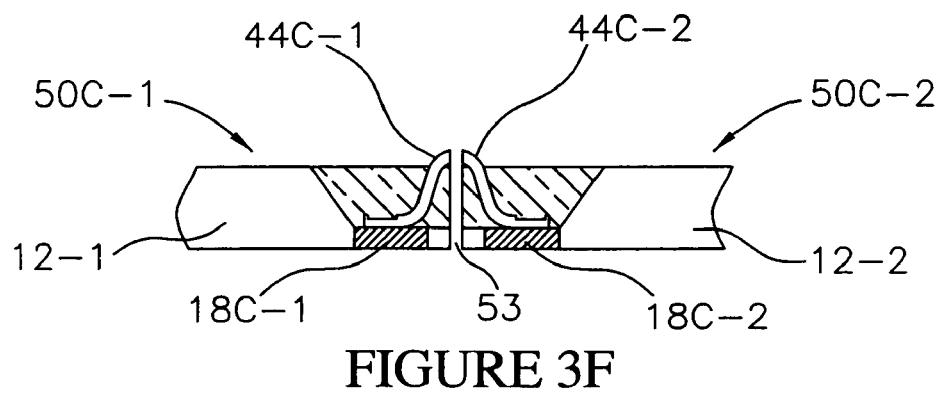

Referring to FIGS. 3E and 3F, alternate embodiment semiconductor components 50C-1, 50C-2 (FIG. 3F) are illustrated. As shown in FIG. 3E, adjacent semiconductor substrates 12-1, 12-2 on the semiconductor wafer 10 are separated by a street area SA. In addition, a substrate opening 30C, spans the street area SA, and encompasses side by side substrate contacts 18C-1, 18C-2 on the adjacent semiconductor substrates 12-1, 12-2. As shown in FIG. 3E, a looped wire 82C is bonded to the substrate contacts 18C-1, 18C-2 using wedge bonds 54C at either end. In addition, a dielectric encapsulant 46C, substantially encapsulates the looped wire 82C (FIG. 3E), while leaving a tip portion thereof exposed. As shown in FIG. 3F, during a singulating step, a groove 53, such as a saw cut, is formed in the street area SA (FIG. 3E) to separate the semiconductor substrates 12-1, 12-2, and to sever the looped wire 82C in the street area SA (FIG. 3E). The semiconductor components 50C-1, 50C-2 (FIG. 3F) include conductive interconnects 44C-1, 44C-2 formed by the severed looped wire 82C (FIG. 3E). The conductive interconnects 44C-1, 44C-2 are embedded in the dielectric encapsulant 46C but have exposed tip portions for making outside electrical connections to the semiconductor components 50C-1, 50C-2.

Figure 3G:
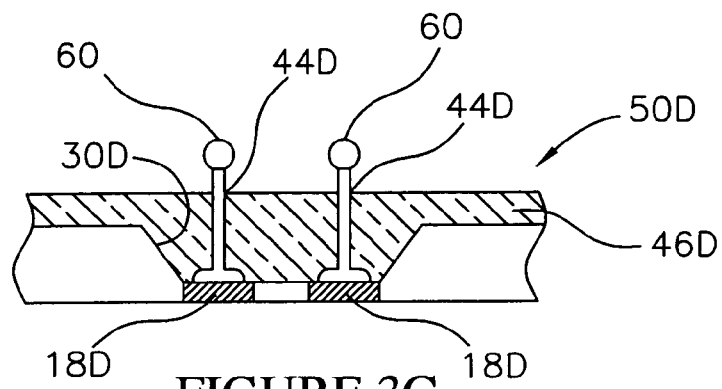
FIG. 3G is a schematic cross sectional view of an alternate embodiment semiconductor component.

Referring to FIG. 3G, an alternate embodiment semiconductor component 50D includes a substrate opening 30D that encompasses side by side substrate contacts 18D. In addition, conductive interconnects 44D are bonded to the substrate contacts 18D substantially as previously described for conductive interconnects 44 (FIG. 1F). The substrate contacts 18D, and the conductive interconnects 44D as well, can have a spacing S as small as about 25 µm using the previously described bonding capillary 34 (FIG. 1E). In addition, the conductive interconnects 44D can include ball tip portions 60 formed of an easily bondable or non oxidizing material, such as solder or gold, configured to form bonded connections between the conductive interconnects 44D and electrodes on another substrate, such as a flex circuit or PCB. The semiconductor component 50D also includes a dielectric encapsulant 46D, which substantially encapsulates and rigidifies the conductive interconnects 44D, while leaving the ball tip portions 60 exposed.

Figure 3H:
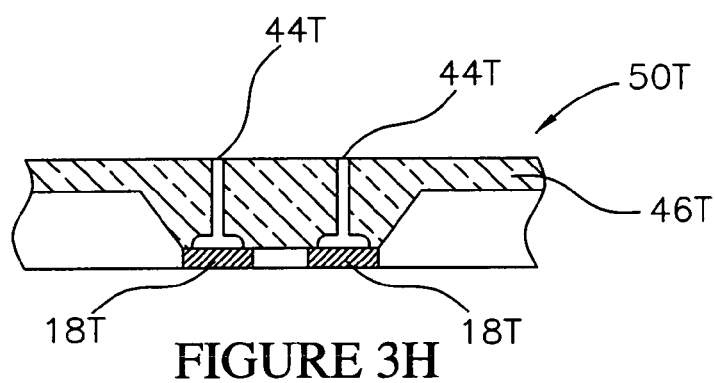
FIG. 3H is a schematic cross sectional view of an alternate embodiment semiconductor component.

Referring to FIG. 3H, an alternate embodiment semiconductor component 50T is substantially similar to the semiconductor component 50D (FIG. 3G). However, the semiconductor component 50T includes planarized conductive interconnects 44T bonded to substrate contacts 18T, and embedded in a planarized dielectric layer 46T. The planarized conductive interconnects 44T and the planarized dielectric layer 46T can be formed using a planarization process such as chemical mechanical planarization (CMP), grinding, or polishing, substantially as previously described for the thinning step of FIG. 1B.

Figure 3I:
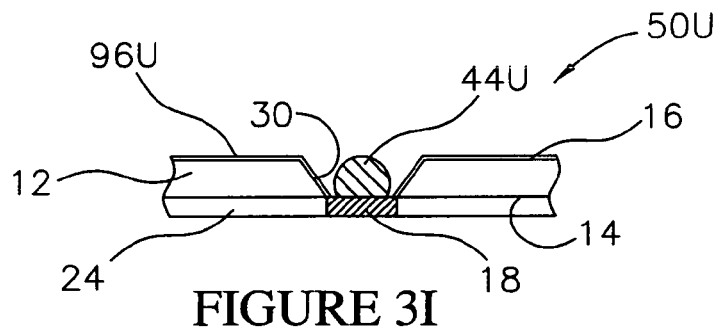
FIG. 3I is a schematic cross sectional view of an alternate embodiment semiconductor component.

Referring to FIG. 3I, an alternate embodiment semiconductor component 50U is substantially similar to the semiconductor component 50 (FIG. 1G). However, the semiconductor component 50U includes conductive interconnects 44U in the form of metal or conductive polymer bumps in the substrate openings 30 (or substrate openings 30A—FIG. 2E) bonded to the substrate contacts 18. The conductive interconnects 44U can be formed using a bumping process, such as solder ball bumping, stud bumping or reflow bonding. Alternately, the conductive interconnects 44U can be formed using a deposition process such as electroless deposition or screen printing. In the illustrative embodiment, the polymer interconnects 44U have a height that is about the same as, but slightly greater than, a depth of the substrate opening 30. The semiconductor component 50U also includes an electrically insulating layer 96U which covers the sidewalls of the openings 30 and the backside 16 of the semiconductor substrate 12. The electrically insulating layer 96U can be formed using a deposition process or a growth process substantially as previously described for insulating layer 96 (FIG. 1D).

Figure 3J:
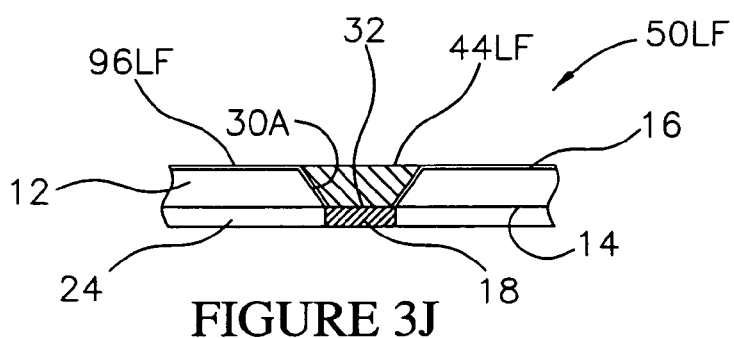
FIG. 3J is a schematic cross sectional view of an alternate embodiment semiconductor component.
Figure 18B:
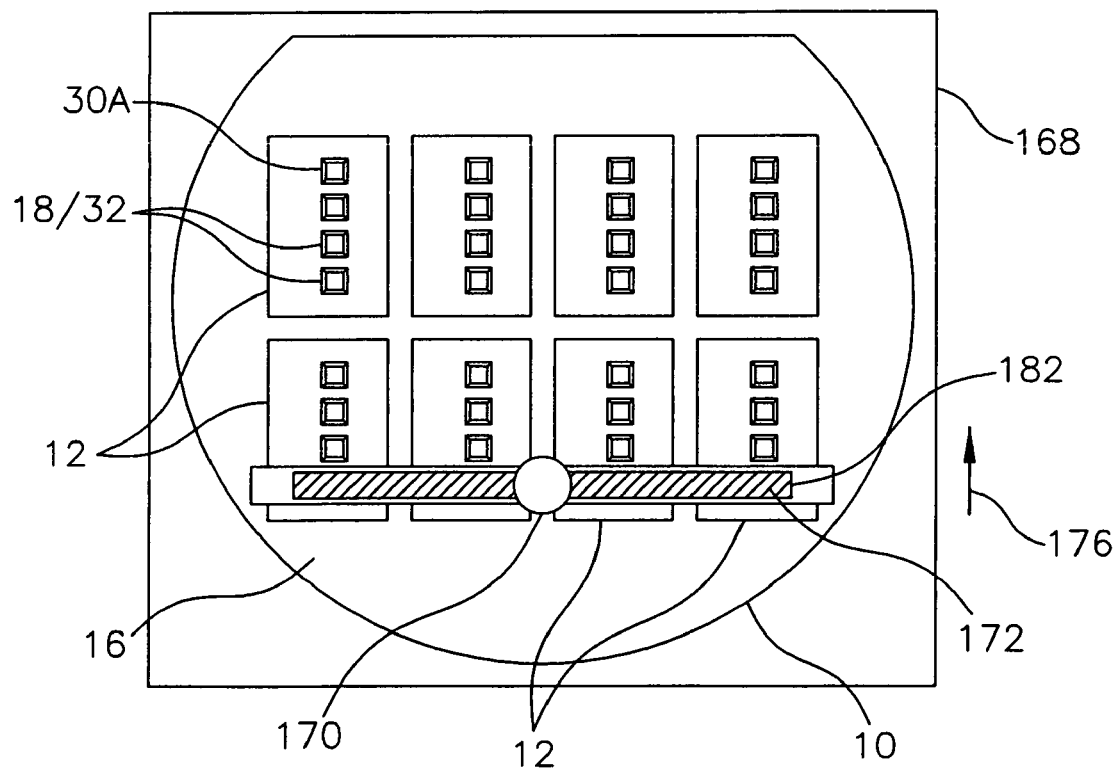

Referring to FIG. 3J, an alternate embodiment semiconductor component 50LF is substantially similar to the semiconductor component 50 (FIG. 1G). The semiconductor component 50LF also includes an electrically insulating layer 96LF which covers the sidewalls of the openings 30A and the backside 16 of the semiconductor substrate 12. However, the semiconductor component 50LF includes conductive interconnects 44LF in the form of planarized solder plugs, substantially filling the openings 30A. The conductive interconnect 44LF can be formed by depositing a solder, such as a lead free solder, into the openings 30A and onto the inner surfaces 32 of the substrate contacts 18. As will be further explained, the conductive interconnects 44LF can be formed by direct deposition from a dispensing mechanism, or by transfer from a bump template having cavities filled with solder by a dispensing mechanism. Methods and systems for forming the conductive interconnects 44LF are shown in FIGS. 18A, 18B and 19, and will be described as the description proceeds.

Figure 4A:
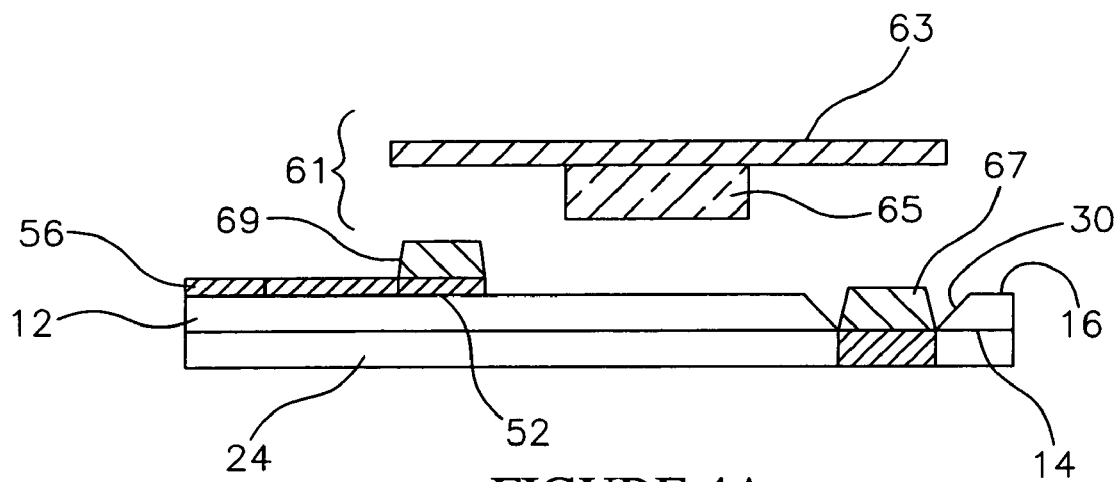
FIGS. 4A-4C are schematic cross sectional views illustrating steps in a method for fabricating an alternate embodiment semiconductor component.
Figure 4B:
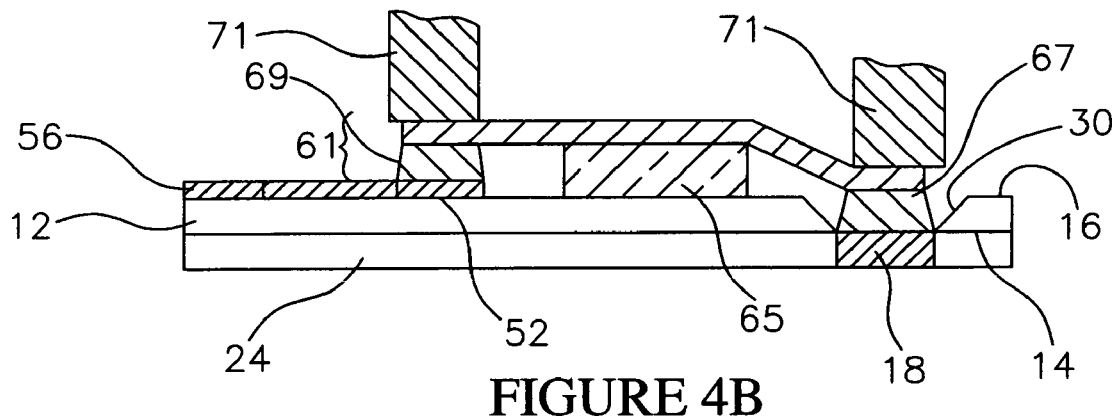
Figure 4C:
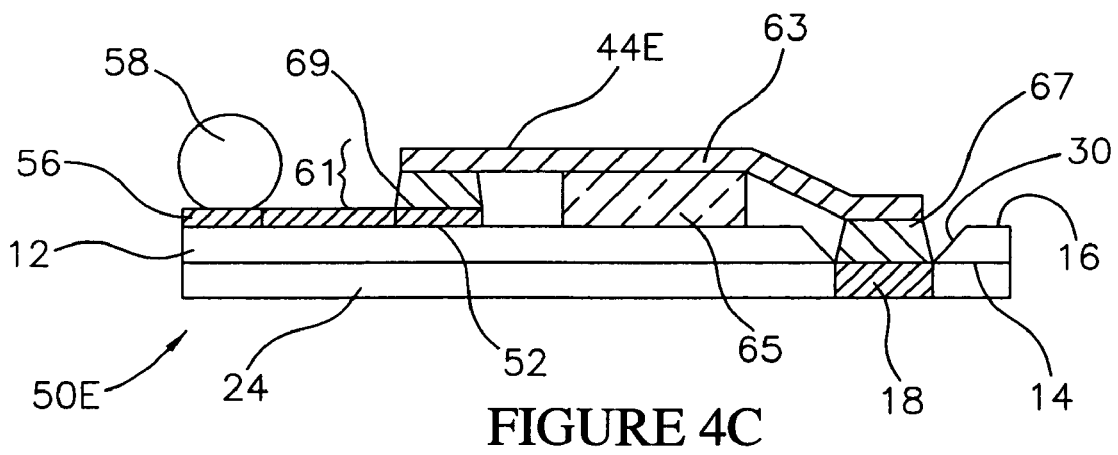

Referring to FIGS. 4A-4C, an alternate embodiment of the method is illustrated, wherein the bonding step is performed using a tape automated bonding (TAB) process. As shown in FIG. 4A, the semiconductor substrate 12 has been subjected to a thinning step, as previously described. The semiconductor substrate 12 includes substrate openings 30 aligned with substrate contacts 18 formed using a substrate opening forming step, as previously described. In addition, the semiconductor substrate 12 includes backside contacts 52 and backside conductors 56 formed using a metallization process as previously described.

Initially, as shown in FIG. 4A, bonding pedestals 67 are formed on the substrate contacts 18. In addition, bonding pedestals 69 are formed on the backside contacts 52. The bonding pedestals 67, 69 can comprise a conventional TAB bondable metal, such as Au, Cu, solder, and alloys of these metals. The bonding pedestals 67, 69 can have any suitable shape including conical, spherical, dome and bump shapes. In addition, the bonding pedestals 67, 69 can comprise multiple layers of different metals, such as an adhesion metal layer (e.g., Cr, Ti, Al), a barrier metal layer (e.g., Ta, Cu, Pd, Pt, Ni), and a bump metal layer (e.g., Au, Cu, solder). The bonding pedestals 67, 69 can be formed using a suitable process such as electroless plating, electrolytic plating, screen printing or deposition through a mask. As an alternative to these processes, the bonding pedestals 67, 69 can comprise stud bumps formed using a stud bumper, such as the previously identified stud bumper manufactured by Kulicke & Soffa Industries, Inc.

As also shown in FIG. 4A, for performing the TAB bonding step, a flex circuit 61 is provided. The flex circuit 61 can comprise a multi layer TAB tape, such as TAB tape manufactured by 3M Corporation of St. Paul, Minn., or "ASMAT" manufactured by Nitto Denko of Japan. The flex circuit 61 includes flex circuit conductors 63 mounted to a polymer substrate 65, which is formed of a material such as polyimide or a photoimageable polymer. The flex circuit 61 is configured such that the terminal portions of the flex circuit conductors 63 align with the bonding pedestals 67, 69.

As shown in FIG. 4B, a bonding tool 71 of a tape automated bonding (TAB) system can be used to bond the terminal portions of the flex circuit conductors 63 to the bonding pedestals 67, 69. The bonding tool 71 can comprise a thermode tool, a gang bonding tool, a thermocompression bonding tool, or a thermosonic bonding tool. Suitable bonding tools, and bonding systems, are available from Kulicke & Soffa Industries Inc., Willow Grove, Pa.; ESEC (USA), Inc., Phoenix, Ariz.; Unitek Equipment, Monrovia, Calif.; and others as well.

As shown in FIG. 4C, following the bonding step, a semiconductor component 50E includes conductive interconnects 44E which comprise the flex circuit 61 having the flex circuit conductors 63 bonded at each end to the bonding pedestals 67, 69. In addition, the semiconductor component 50E includes terminal contacts 58 in electrical communication with the conductive interconnects 44E, substantially as previously described.

Figure 4D:
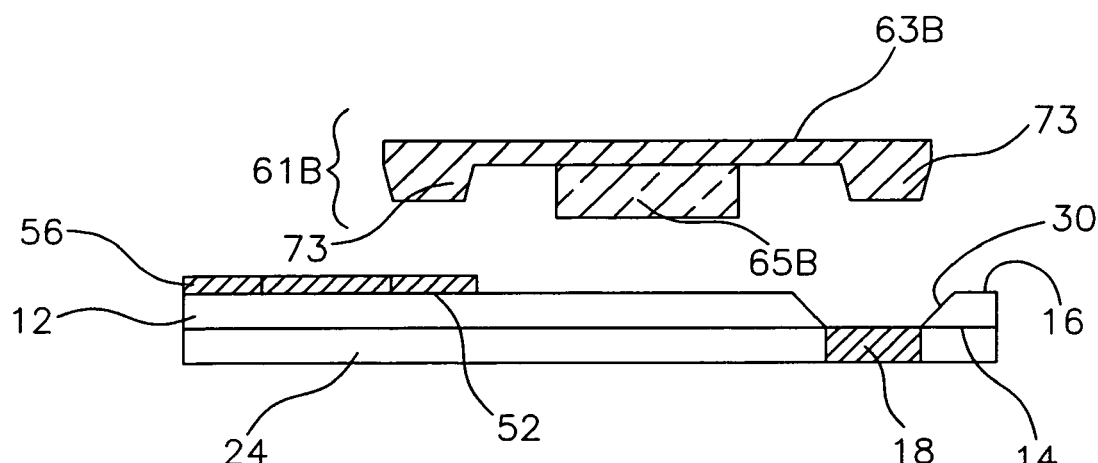
FIGS. 4D-4F are schematic cross sectional views illustrating steps in a method for fabricating an alternate embodiment semiconductor component.
Figure 4E:
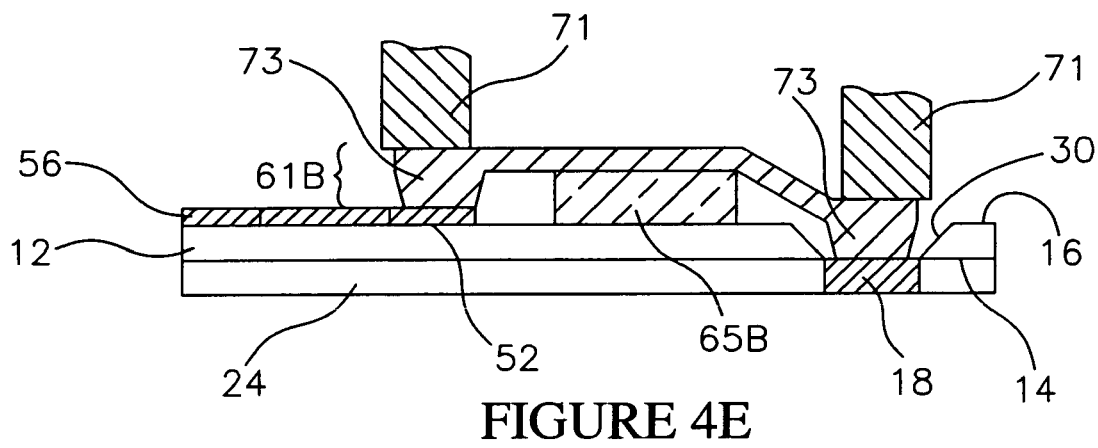
Figure 4F:
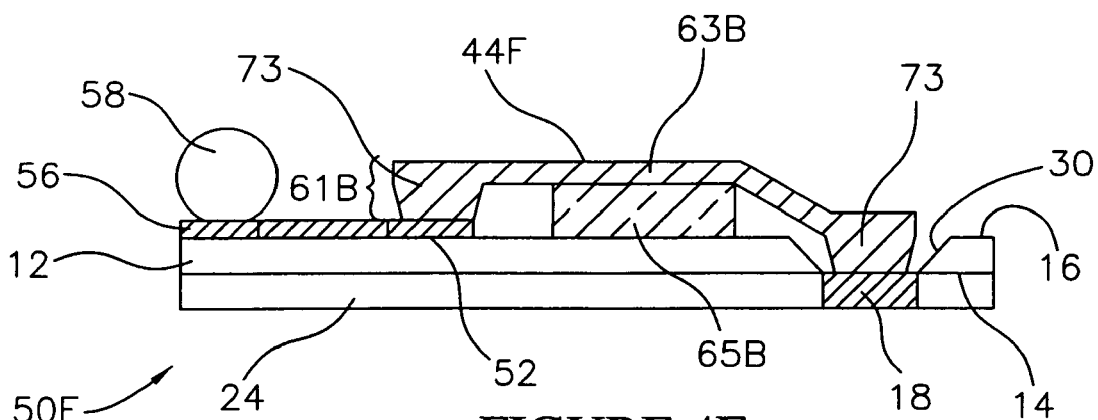

Referring to FIGS. 4D-4F, an alternate embodiment of the method of FIGS. 4A-4C is illustrated. In this embodiment the bonding pedestals 67, 69 (FIG. 4A) are not formed, as a bumped flex circuit 61B is employed. As shown in FIG. 4D, the bumped flex circuit 61B includes flex circuit conductors 63B having bumps 73 on either end, formed of a bondable metal such as Au, Cu or solder. As shown in FIG. 4E, the bonding tool 71 bonds the bumps 73 directly to the substrate contacts 18 and to the back side contacts 52. As shown in FIG. 4F, a semiconductor component 50F includes conductive interconnects 44F, which comprise the bumped flex circuit 61B having the flex circuit conductors 63B bonded to the substrate contacts 18 and to the backside contacts 52. In addition, the semiconductor component 50F includes terminal contacts 58 in electrical communication with the conductive interconnects 44F, substantially as previously described.

Figure 5A:
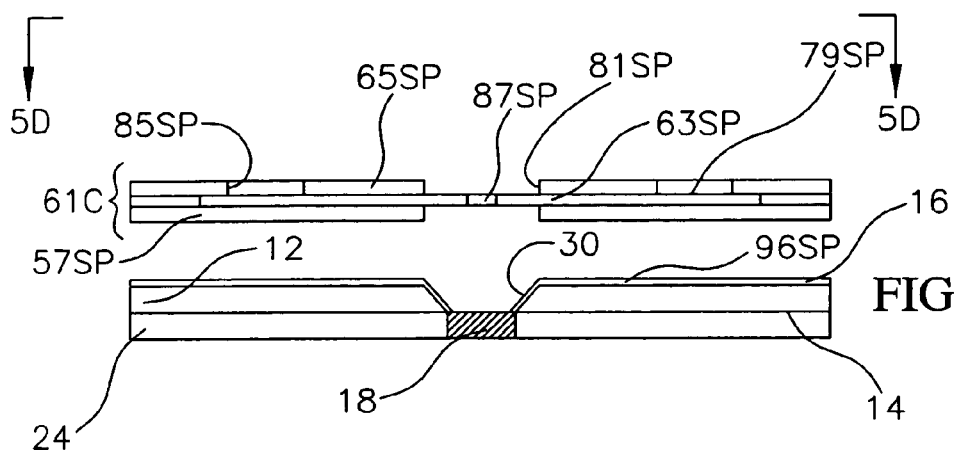
FIGS. 5A-5C are schematic cross sectional views illustrating steps in a method for fabricating an alternate embodiment semiconductor component.

Referring to FIGS. 5A-5D, an alternate embodiment of the method is performed using flex circuit 61SP configured for single point TAB bonding. Initially, as shown in FIG. 5A, the semiconductor substrate 12 includes substrate contacts 18 and substrate openings 30, as previously described. The semiconductor substrate 12 also includes an electrically insulating layer 96SP which covers the sidewalls of the openings 30 and the backside 16 of the semiconductor substrate 12 as well. The electrically insulating layer 96SP can be formed substantially as previously described for electrically insulating layer 96 (FIG. 1D).

Figure 5B:
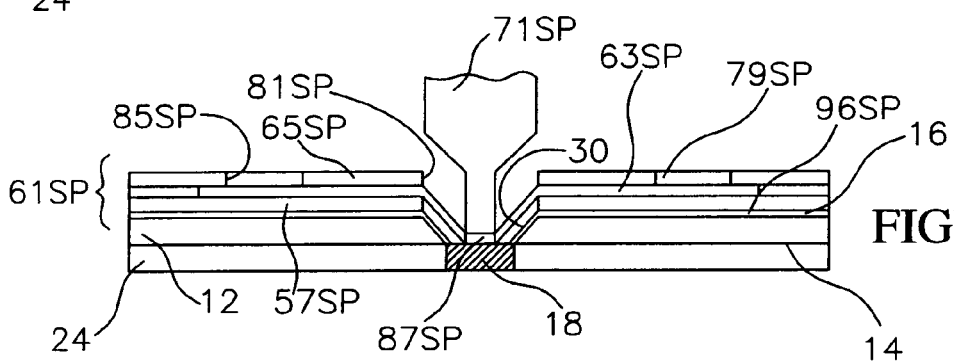
Figure 5C:
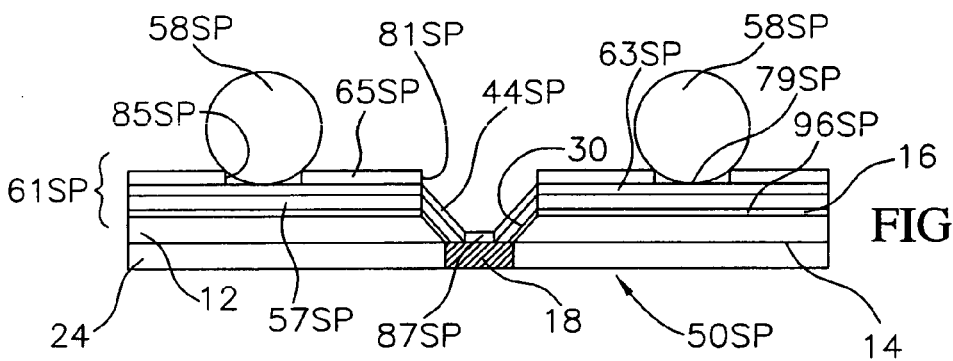
Figure 5D:
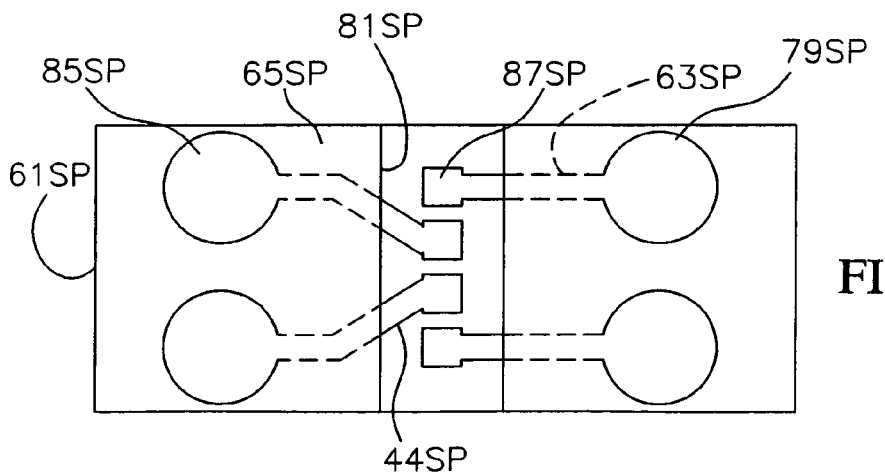
FIG. 5D is a plan view taken along line 5D-5D of FIG. 5A.

As shown in FIGS. 5A and 5D, the single point flex circuit 61SP includes a polymer substrate 65SP having a bonding opening 81SP aligned with the substrate contacts 18. The polymer substrate 65SP also includes terminal contact openings 85SP in an area array configured for mounting terminal contacts 58SP (FIG. 5C). The polymer substrate 65SP can comprise a photoimageable polymer such as one manufactured by DuPont or Hitachi. In addition to providing a support structure, the polymer substrate 65SP also functions as a solder mask for the terminal contacts 58SP (FIG. 5C).

The single point flex circuit 61SP also includes flex circuit conductors 63SP on an inside surface of the polymer substrate 65SP. The flex circuit conductors 63SP include terminal contact pads 79SP aligned with the terminal contact openings 85SP. The flex circuit conductors 63SP also include bonding pads 87SP configured for bonding to the substrate contacts 18. The single point flex circuit 61SP also includes a compliant adhesive layer 57SP configured to attach the flex circuit 61C to the semiconductor substrate 12. The compliant adhesive layer 57SP can comprise a polymer material, such as silicone or epoxy, configured as an adhesive member, and as an expansion member for compensating for any TCE mismatch between the flex circuit 61SP and the semiconductor substrate 12.

As shown in FIG. 5B, a single point bonding tool 71SP can be used to bond the bonding pads 87SP on the flex circuit conductors 63SP to the substrate contacts 18. In this case the bonding opening 81SP provides access for the single point bonding tool 71SP. Suitable single point bonding tools 71SP are manufactured by Kulicke & Soffa as well as other manufactures.

As shown in FIG. 5C, the terminal contacts 58SP can be formed on the terminal contact pads 79SP using a bonding or deposition process substantially as previously described for terminal contacts 58 (FIG. 3A). As also shown in FIG. 5C, a semiconductor component 50SP includes the semiconductor substrate 12 and the single point flex circuit 61SP attached thereto. The semiconductor component 50SP also includes conductive interconnects 44SP, which comprise portions of the flex circuit conductors 63SP and the bonding pads 87SP bonded to the substrate contacts 18. The semiconductor component 50SP also includes terminal contacts 58SP in an area array in electrical communication with the conductive interconnects 44SP. The terminal contacts 58SP are also known in the art as outer lead bonds (OLB).

Figure 6A:
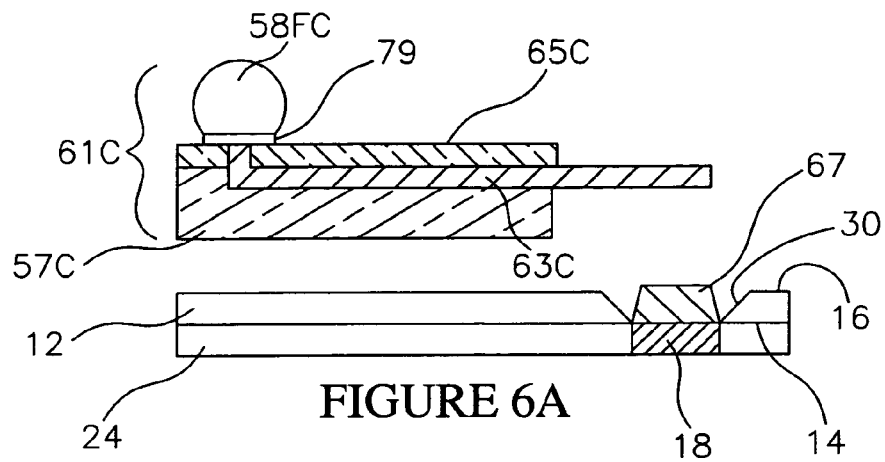
FIGS. 6A-6D are schematic cross sectional views illustrating steps in a method for fabricating an alternate embodiment semiconductor component.
Figure 6B:
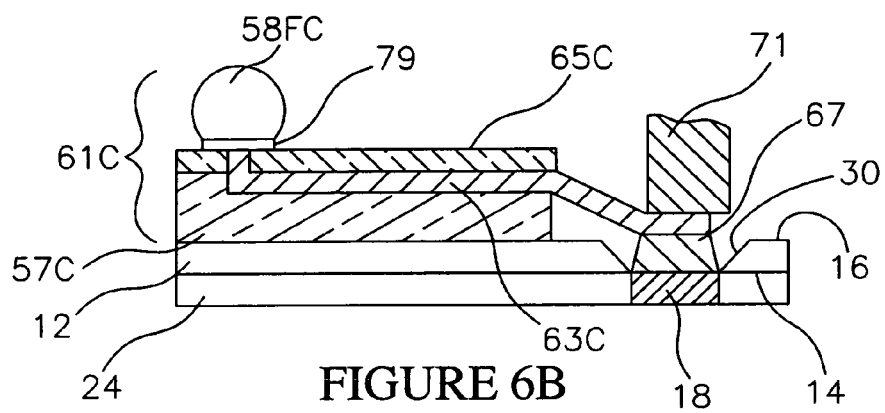
Figure 6C:
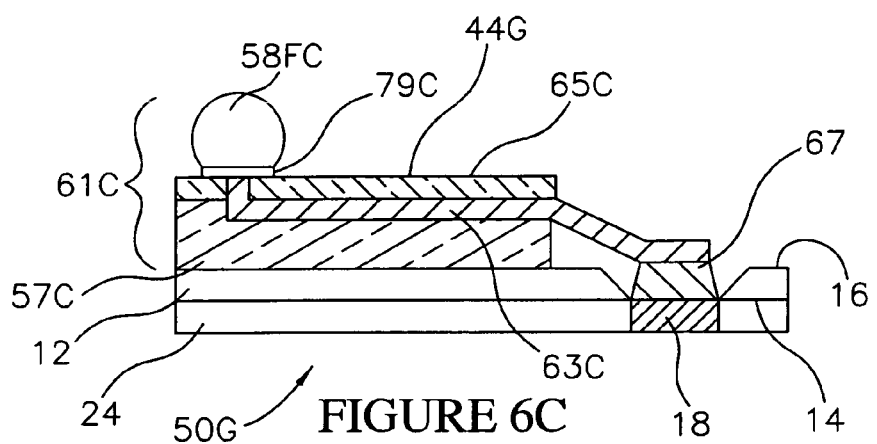

Referring to FIGS. 6A-6C, an alternate embodiment of the method is illustrated, wherein the bonding step is performed using a flex circuit 61C having a polymer substrate 65C and a compliant adhesive layer 57C configured to attach the flex circuit 61C to the semiconductor substrate 12. The polymer substrate 65C includes flex circuit conductors 63C on an inside surface thereof in electrical communication with terminal contact pads 79C on an outside surface thereof. Alternately, as will be further explained, the flex circuit conductors 63C can be formed on an outside surface of the polymer substrate 65C.

As shown in FIG. 6B, the bonding tool 71 bonds the terminal portions of the flex circuit conductors 63C to the pedestals 67 on the substrate contacts 18. In addition, the compliant adhesive layer 57C attaches the flex circuit 61C to the semiconductor substrate 12, substantially as previously described for compliant adhesive layer 57SP (FIG. 5A).

As shown in FIG. 6C, following attachment of the flex circuit 61C to the semiconductor substrate 65C, terminal contacts 58FC are bonded to the terminal contact pads 79C, substantially as previously described for terminal contacts 58 (FIG. 3A). As also shown in FIG. 6C, a semiconductor component 50G includes conductive interconnects 44G, which comprise the flex circuit 61C having the flex circuit conductors 63C bonded to the substrate contacts 18. In addition, the conductive interconnects 44G include the terminal contacts 58FC on the outside surface of the polymer substrate 65C in electrical communication with the conductive interconnects 44F on the inside surface of the polymer substrate 65C.

Figure 6D:
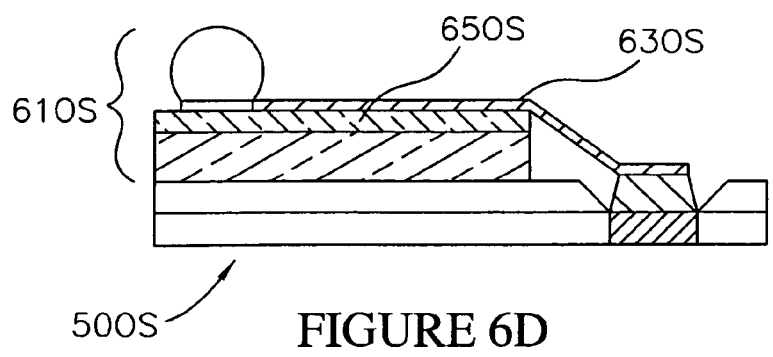

Referring to FIG. 6D, an alternate embodiment semiconductor component 50OS is substantially similar to the semiconductor component 50G (FIG. 6C). However, the semiconductor component 50OS includes a flex circuit 61OS having flex circuit conductors 63OS on an outside surface of polymer substrate 65OS.

Figure 7A:
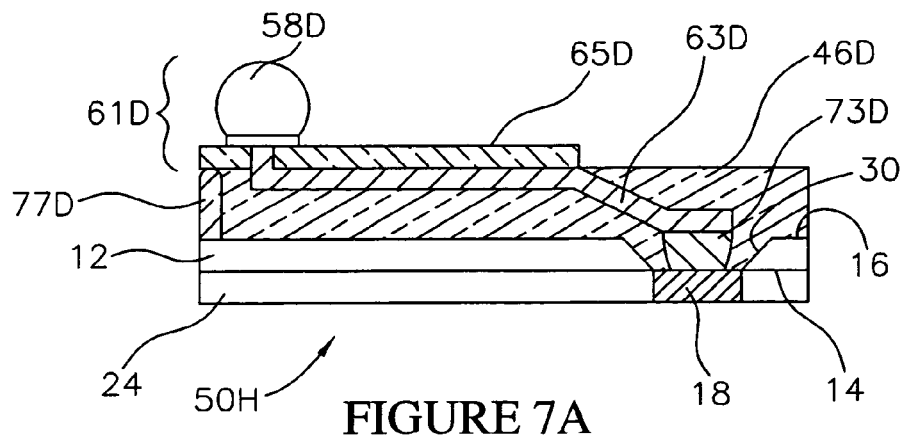
FIGS. 7A-7D are schematic cross sectional views of alternate embodiment semiconductor components.

Referring to FIG. 7A, an alternate embodiment semiconductor component 50H includes a flex circuit 61D with flex circuit conductors 63D on an inside surface of the polymer substrate 65D. Alternately, the flex circuit conductors 63D can be located on an outside surface of the polymer substrate 65D. The flex circuit conductors 63D include bumps 73D bonded directly to the substrate contacts 18, substantially as previously described for the bumped flex circuit conductors 63B (FIG. 5C). The semiconductor component 50H also includes spacers 77D, and a dielectric encapsulant 46D between the flex circuit 61D and the semiconductor substrate 12. The spacers 77D can comprise an electrically insulating polymer material, such as a silicone, an epoxy, or an adhesive material. The spacers 77D can be formed in a tacking configuration or as a continuous ridge, and can be pre-formed on the flex circuit 61D. The dielectric encapsulant 46D can comprise an underfill polymer configured to compensate for any TCE mismatch between the flex circuit 61D and the semiconductor substrate 12. U.S. Pat. No. 6,740,960 B1, entitled "Semiconductor Package Including Flex Circuit, Interconnects And Dense Array External Contacts", which is incorporated herein by reference, further describes bonding of bumps to flex circuit conductors.

Figure 7B:
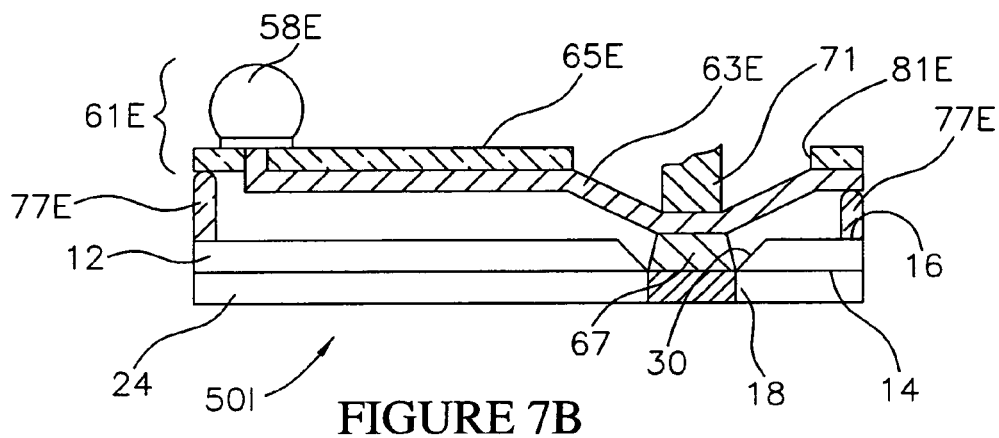

Referring to FIG. 7B, an alternate embodiment semiconductor component 50I includes a flex circuit 61E having a polymer substrate 65E having openings 81E aligned with the bonding pedestals 67 on the substrate contacts 18. The openings 81E provide access for the bonding tool 71 for bonding intermediate portions of flex circuit conductors 63E to the bonding pedestals 67 on the substrate contacts 18. In addition, spacers 77E space the polymer substrate 65E from the semiconductor substrate 12 during the bonding process. The spacers 77E can be configured substantially as previously described for spacers 77D (FIG. 7A).

Figure 7C:
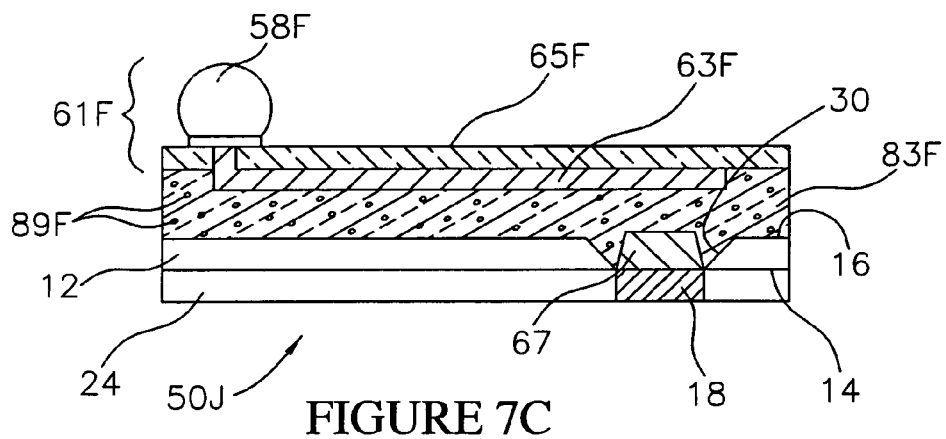

Referring to FIG. 7C, an alternate embodiment semiconductor component 50J includes a flex circuit 61F having flex circuit conductors 63F on a polymer substrate 65F bonded to the bonding pedestals 67 on the substrate contacts 18 using a conductive polymer layer 83F. The conductive polymer layer 83F includes conductive particles 89F in an electrically insulating base material configured to provide electrical conductivity in the z-direction and electrical isolation in the x and y directions. The conductive polymer layer 83F can comprise a z-axis anisotropic adhesive such as "Z-POXY" manufactured by A.I. Technology, of Trenton, N.J., or "SHELL-ZAC" manufactured by Sheldahl, of Northfield, Minn.

Figure 7D:
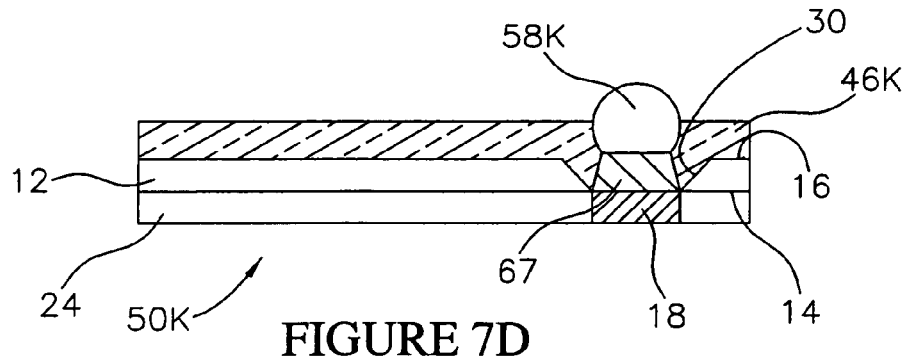

Referring to FIG. 7D, an alternate embodiment semiconductor component 50K includes terminal contacts 58K bonded directly to the bonding pedestals 67 on the substrate contacts 18. The terminal contacts 58K can comprise metal or conductive polymer balls or bumps, bonded to the bonding pedestals 67. For example, solder balls can be placed on the pedestals and reflow bonded using a thermal reflow oven, or a laser solder ball bumper. As another example, the terminal contacts 58K can comprise metal bumps formed on the bonding pedestals 67 using a stud bumper. As another example, the terminal contacts 58K can comprise conductive polymer bumps cured in contact with the bonding pedestals 67.

Figure 8A:
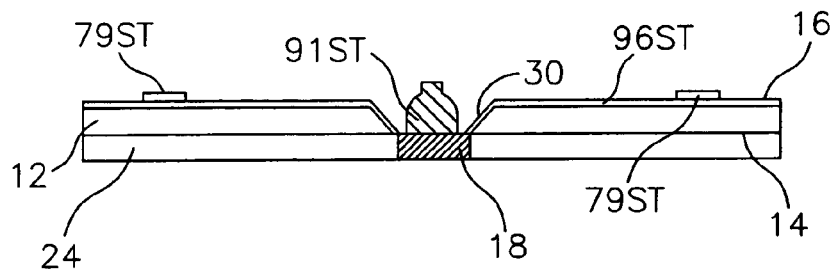
FIGS. 8A-8D are schematic cross sectional views illustrating steps in a method for fabricating an alternate embodiment semiconductor component.

Referring to FIGS. 8A-8D, an alternate embodiment method is illustrated, wherein the bonding step is performed using a stud bumping process. As shown in FIG. 8A, the semiconductor substrate 12 includes substrate contacts 18 and substrate openings 30, as previously described. The semiconductor substrate 12 also includes an electrically insulating layer 96ST which covers the sidewalls of the openings 30 and the backside 16 of the semiconductor substrate 12 as well. The electrically insulating layer 96ST can be formed substantially as previously described for electrically insulating layer 96 (FIG. 1D).

As also shown in FIG. 8A, bumps 91ST are formed on the substrate contacts 18. The bumps 91ST can comprise stud bumps formed using a stud bumper, such as the previously identified stud bumper manufactured by Kulicke & Soffa, Inc. Alternately, the bumps 91ST can comprise metal bumps or balls formed on the substrate contacts 18 using a deposition process, such as electroless deposition or screen printing, or a bonding process such as thermal reflow of solder balls or laser solder ball bonding.

Figure 8B:
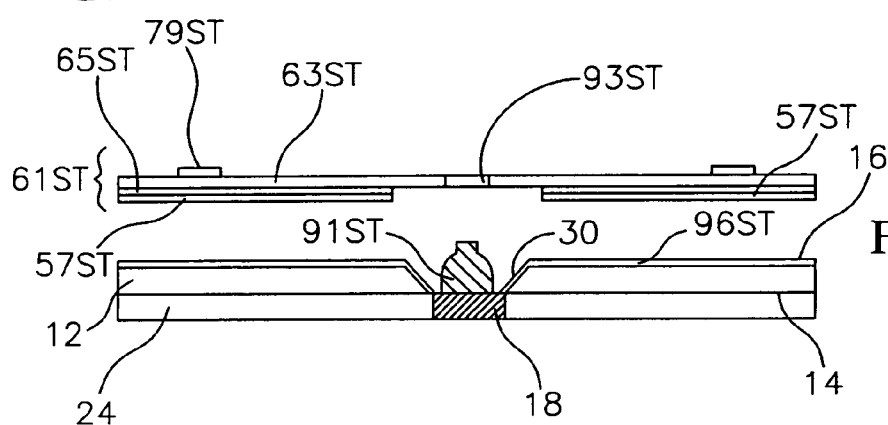

As shown in FIG. 8B, a flex circuit 61ST includes a polymer substrate 65ST, and flex circuit conductors 63ST on an outside surface thereof in electrical communication with terminal contact pads 79ST. Alternately, the flex circuit conductors 63ST can be formed on an inside surface of the polymer substrate 65ST. The flex circuit conductors 63ST also include openings 93ST that align with the bumps 91ST on the substrate contacts 18. In addition, the polymer substrate 65ST includes a compliant adhesive layer 57ST substantially as previously described for compliant adhesive layer 57SP (FIG. 5A).

Figure 8C:
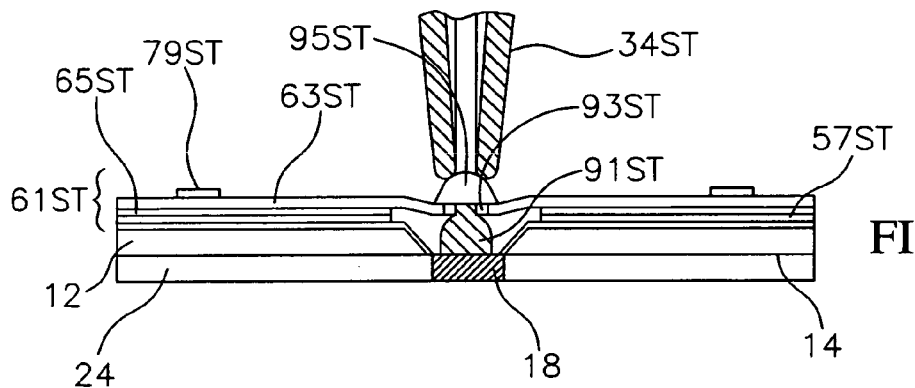

As shown in FIG. 8C, the flex circuit is attached to the semiconductor substrate 12 using the compliant adhesive layer 57ST. In addition, the openings 93ST in the flex circuit conductors 63ST align with the bumps 91ST on the substrate contacts 18. As also shown in FIG. 8C, a bonding capillary 34ST is used to form second bumps 95ST in the openings 93ST bonded to the bumps 91ST on the substrate contacts 18. In the illustrative embodiment, the bonding capillary 34ST is configured to form the second bumps as stud bumps. However, the second bumps 95ST can also comprise wedge bonds, similar to "security bonds" used in the art.

Figure 8D:
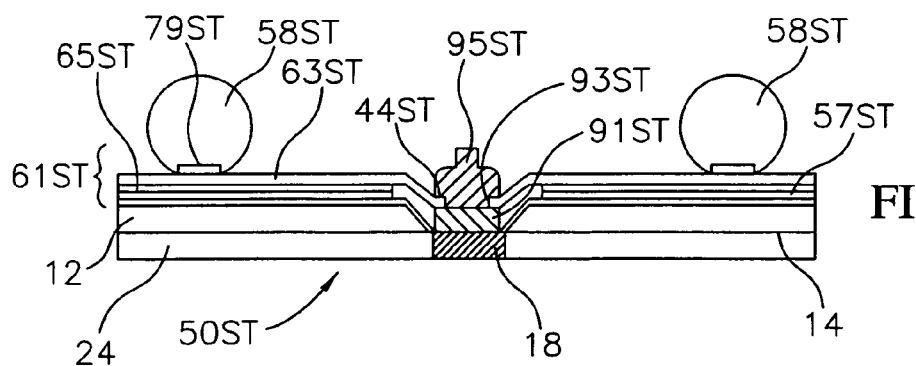

As shown in FIG. 8D, the second bumps 95ST form rivet like bonded connections between the flex circuit conductors 63ST and the bumps 91ST on the substrate contacts 18. To form the rivet like connections, the second bumps 95ST can have an outside diameter larger than that of the openings 93ST in the flex circuit conductors 63ST such that annular shoulders on the second bumps 95ST bond the flex circuit conductors 63ST to the bumps 91ST. In addition, terminal contacts 58ST are formed on the terminal contact pads 79ST substantially as previously described for terminal contacts 58 (FIG. 3A). A semiconductor component 50ST includes conductive interconnects 44ST which comprise the bumps 91ST and the second bumps 95ST.

Figure 8E:
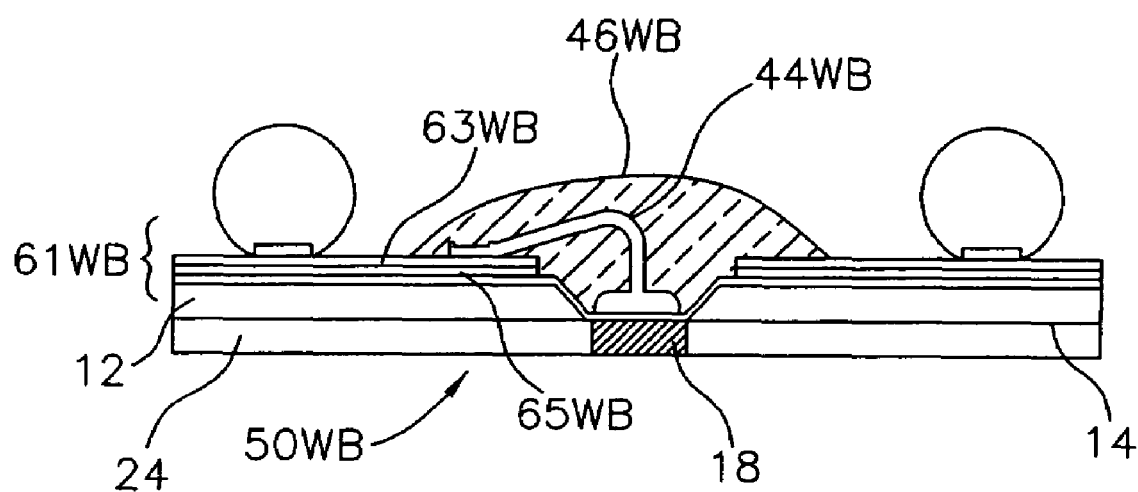
FIG. 8E is a schematic cross sectional view equivalent to FIG. 8D of an alternate embodiment semiconductor component.

Referring to FIG. 8E, an alternate embodiment semiconductor component 50WB is substantially similar to the semiconductor component 50ST (FIG. 8D). However, the semiconductor component 50WB includes conductive interconnects 44WB comprising wires that are wire bonded to the substrate contacts 18 and to flex circuit conductors 63WB. In addition, the flex circuit conductors 63WB are mounted on a polymer substrate 65WB attached to the semiconductor substrate 12. Further, a wire bond encapsulant 46WB encapsulates the conductive interconnects 44WB.

Figure 9:
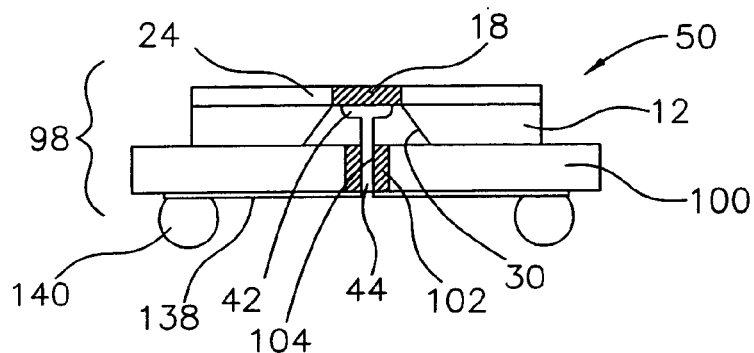
FIG. 9 is a schematic cross sectional view of a module semiconductor component constructed in accordance with the invention.

Referring to FIG. 9, a module component 98 is illustrated. The module component 98 includes the semiconductor component 50 mounted to a support substrate 100 such as a module substrate, a PCB, or another semiconductor component, such as a die or a chip scale package. The support substrate 100 includes plated openings 102 configured to receive the conductive interconnects 44 on the semiconductor component 50. The support substrate 100 also includes conductors 138 and terminal contacts 140 in electrical communication with the plated openings 102. In addition, bonded connections 104 are formed between the plated openings 102 and the conductive interconnects 44. The bonded connections 104 can comprise solder joints, mechanical connections, welded connections, or conductive polymer connections formed between the plated openings 102 and the conductive interconnects 44.

Figure 10:
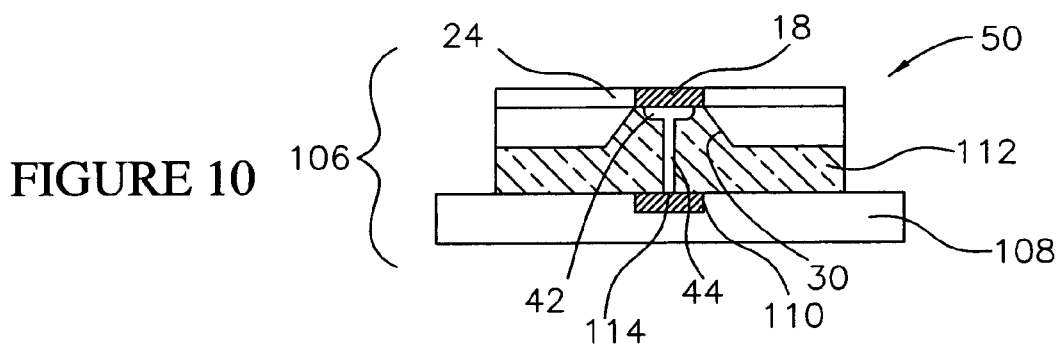
FIG. 10 is a schematic cross sectional view of an underfilled semiconductor component constructed in accordance with the invention.

Referring to FIG. 10, an underfilled component 106 is illustrated. The underfilled component 106 includes the semiconductor component 50 mounted to a support substrate 108, such as a module substrate, a PCB, or another semiconductor component, such as a die or chip scale package. The support substrate 108 includes electrodes 110 configured to be physically bonded to the conductive interconnects 44 on the semiconductor component 50. In addition, bonded connections 114 are formed between the electrodes 110 and the conductive interconnects 44. The bonded connections 114 can comprise solder joints, mechanical connections, welded connections, or conductive polymer connections formed between the electrodes 110 and the conductive interconnects 44. The underfilled component 106 also includes an underfill layer 112 located in a gap between the semiconductor component 50 and the support substrate 108. The underfill layer 112 can comprise a conventional underfill material such as a deposited and cured epoxy. Optionally, the underfill layer 112 can comprise a material configured to remove heat from the semiconductor component 50.

Figure 11A:
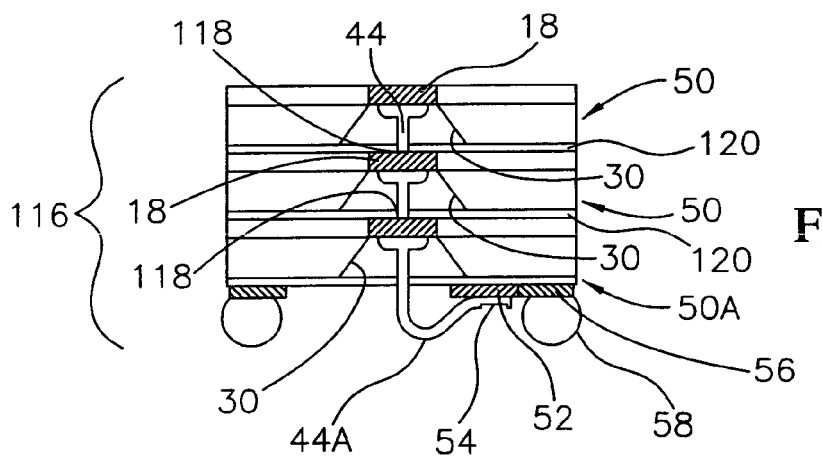
FIGS. 11A and 11B are schematic cross sectional views of stacked semiconductor components constructed in accordance with the invention.

Referring to FIG. 11A, a stacked semiconductor component 116 is illustrated. The stacked semiconductor component 116 includes the semiconductor component 50A having the conductive interconnects 44A and the terminal contacts 58. The terminal contacts 58 can be bonded to mating electrodes (not shown) on a support substrate (not shown). The stacked semiconductor component 116 also includes two semiconductor components 50 stacked on the semiconductor component 50A. The conductive interconnects 44 on the middle semiconductor component 50 are bonded to the corresponding substrate contacts 18 on the semiconductor component 50A. In addition, the conductive interconnects 44 on the top semiconductor component 50 are bonded to the substrate contacts 18 on the middle semiconductor component 50. Further, bonded connections 118 are formed between the conductive interconnects 44 and the substrate contacts 18. The bonded connections 118 can comprise thermocompressive connections, thermosonic connections, or ultrasonic connections formed using a bonding tool 71 (FIG. 4B), substantially as previously described. Alternately, the bonded connections 118 can comprise solder joints, mechanical connections, welded connections, or conductive polymer connections formed between the conductive interconnects 44A and the substrate contacts 18 on adjacent semiconductor components 50 or 50A. As another alternative, the bonded connections 118 can be detachable connections such that the stacked semiconductor component 116 can be disassembled and reassembled. In addition, underfill layers 120 can be formed in the gaps between the semiconductor components 50 or 50A to compensate for TCE mismatches or to conduct heat in a particular direction in the stacked semiconductor component 116.

Figure 11B:
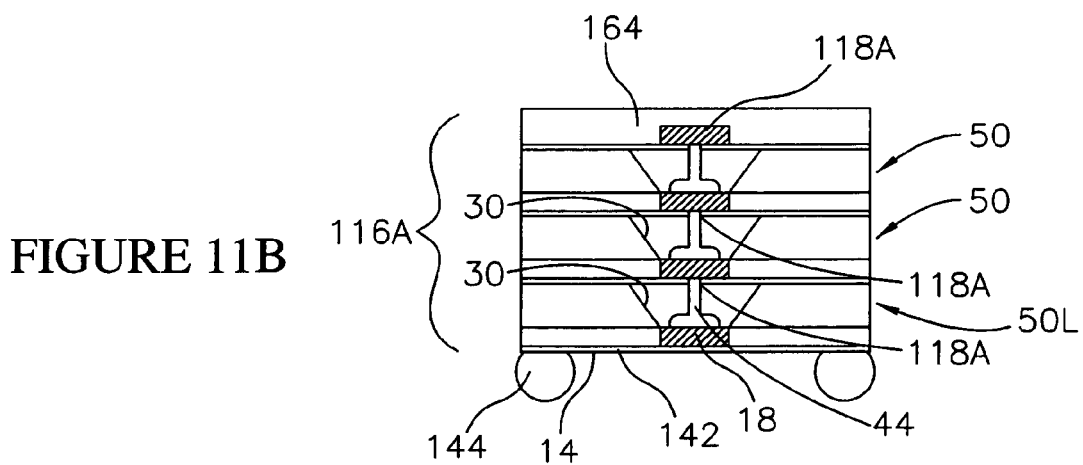

Referring to FIG. 11B, an alternate embodiment stacked semiconductor component 116A is illustrated. The stacked semiconductor component 116A includes a semiconductor component 50L, which is substantially similar to the semiconductor component 50 (FIG. 1G), but includes conductors 142 and terminal contacts 144 on its circuit side 14 in electrical communication with the substrate contacts 18. The stacked semiconductor component 116A also includes two stacked semiconductor components 50 having bonded connections 118A, such as metal layers or conductive polymer layers, bonded to adjacent conductive interconnects 44 and substrate contacts 18. The stacked semiconductor component 116A also includes a cap component 164, such as a semiconductor package, flip chip bonded to the conductive interconnects 44 on one of the semiconductor components 50.

Figure 12A:
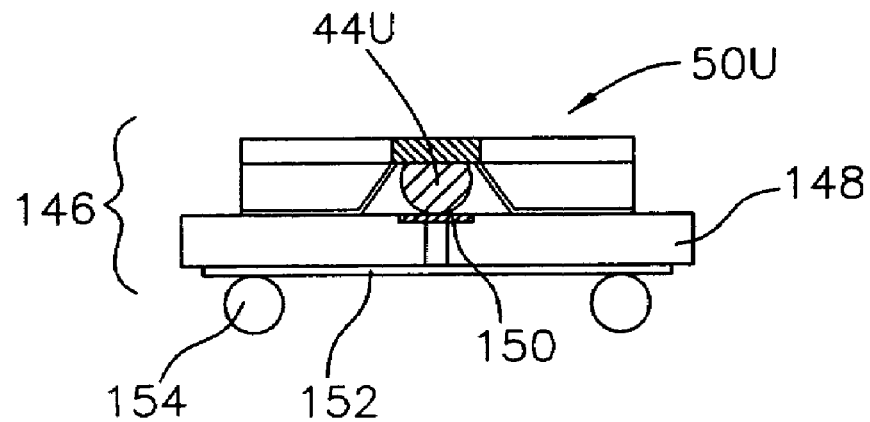
FIG. 12A is a schematic cross sectional view of an alternate embodiment module semiconductor component constructed in accordance with the invention.

Referring to FIG. 12A, an alternate embodiment module semiconductor component 146 includes the semiconductor component 50U (FIG. 3I) on a supporting substrate 148. The supporting substrate 148 includes electrodes 150 in electrical communication with conductors 152 and terminal contacts 154. In addition, the conductive interconnects 44U are bonded to the electrodes 150 using a suitable process such as reflow bonding or conductive polymer bonding.

Figure 12B:
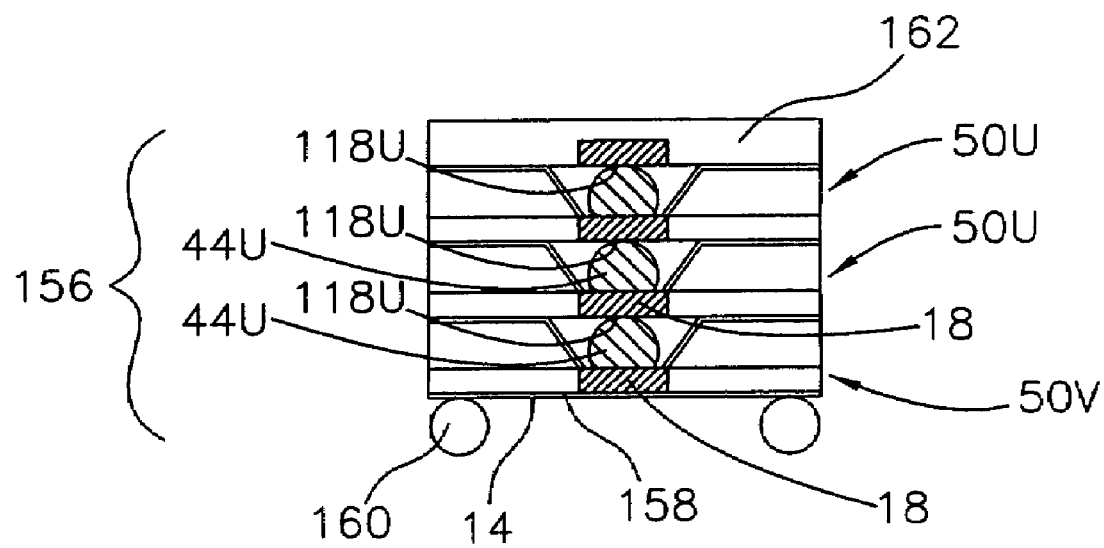
FIG. 12B is a schematic cross sectional view of an alternate embodiment stacked semiconductor component constructed in accordance with the invention.

Referring to FIG. 12B, an alternate embodiment stacked semiconductor component 156 is illustrated. The stacked semiconductor component 156 includes a semiconductor component 50V, which is substantially similar to the semiconductor component 50U (FIG. 3I), but includes conductors 158 and terminal contacts 160 on its circuit side 14 in electrical communication with the substrate contacts 18. The stacked semiconductor component 156 also includes two stacked semiconductor components 50U having bonded connections 118U, such as metal layers or conductive polymer layers, bonded to adjacent conductive interconnects 44U and substrate contacts 18. The stacked semiconductor component 156 also includes a cap component 162, such as a semiconductor package, flip chip bonded to the conductive interconnects 44U on one of the semiconductor components 50U. Alternately, the stacked semiconductor component 156 could be made using semiconductor component 50LF (FIG. 3J) in place of the semiconductor component 50U and bonding the conductive interconnects 44LF rather than the conductive interconnects 44U to the substrate contacts 18.

Figure 13:
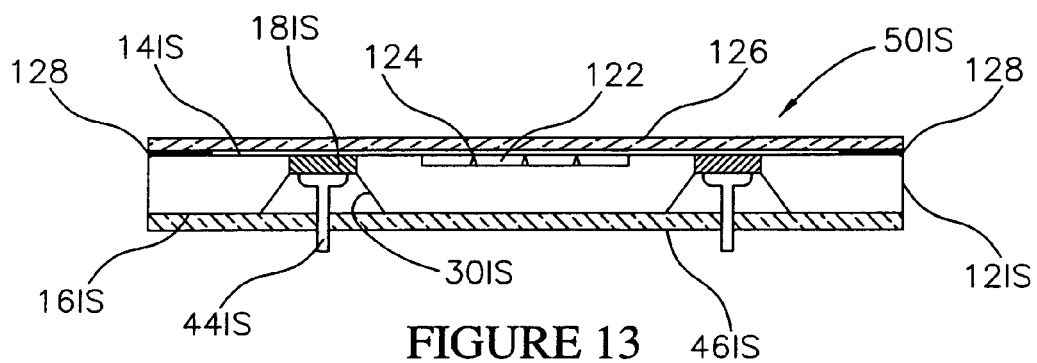
FIG. 13 is a schematic cross sectional view of an image sensor semiconductor component constructed in accordance with the invention.

Referring to FIG. 13, an image sensor semiconductor component 50IS is illustrated. The image sensor semiconductor component 50IS includes a semiconductor substrate 12IS having a circuit side 14IS and a backside 16IS. In addition, the semiconductor substrate 12IS includes an image sensor 122 on the circuit side 14IS having an array of light detecting elements 124, such as photo diodes, or photo transistors, each of which is capable of responding to light, or other electromagnetic radiation, impinging thereon. The semiconductor substrate 12IS also includes substrate contacts 18IS on the circuit side 14IS in electrical communication with the light detecting elements 124. The image sensor semiconductor component 50IS (FIG. 13) also includes a transparent substrate 126 (FIG. 13), such as glass, that is transparent to light or other electromagnetic radiation. The image sensor semiconductor component 50IS (FIG. 13) also includes polymer spacers 128 (FIG. 13), such as epoxy, which attach the transparent substrate 126 (FIG. 13) to the semiconductor substrate 12IS (FIG. 13).

The image sensor semiconductor component 50IS (FIG. 13) also includes substrate openings 30IS (FIG. 13), conductive interconnects 44IS (FIG. 13) and a dielectric encapsulant 46IS (FIG. 13), formed substantially as previously described for the substrate openings 30 (FIG. 1G), the conductive interconnects 44 (FIG. 1G) and the dielectric encapsulant 46 (FIG. 1G).

Figure 14:
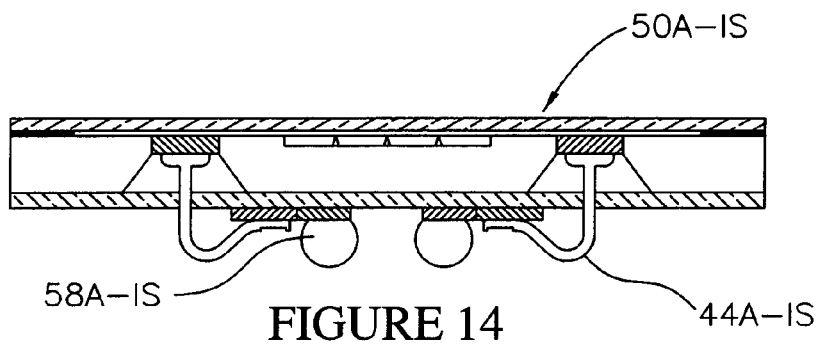
FIG. 14 is a schematic cross sectional view of an image sensor semiconductor component constructed in accordance with the invention.

Referring to FIG. 14, an alternate embodiment image sensor semiconductor component 50A-IS is illustrated. The image sensor semiconductor component 50A-IS is constructed substantially the same as image sensor semiconductor component 50IS (FIG. 13), but includes conductive interconnects 44A-IS in electrical communication with terminal contacts 58A-IS. The conductive interconnects 44A-IS and the terminal contacts 58A-IS are formed substantially as previously described for conductive interconnects 44A (FIG. 3A) and the terminal contacts 58 (FIG. 3A).

Figure 15A:
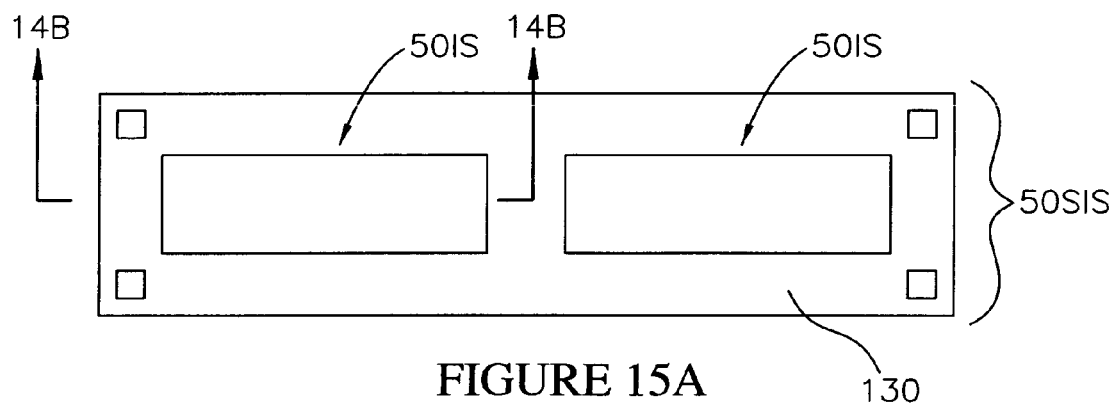
FIG. 15A is a schematic plan view of a stacked image sensor semiconductor component constructed in accordance with the invention.
Figure 15B:
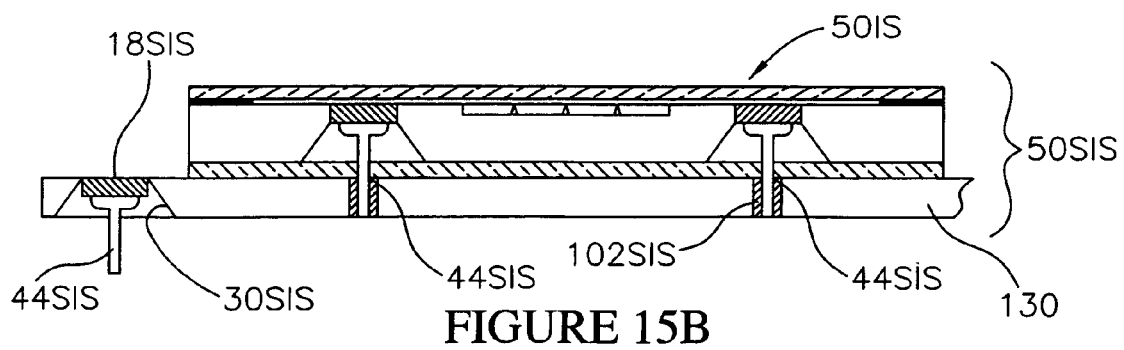
FIG. 15B is a schematic cross sectional view of the stacked image sensor semiconductor component taken along section line 14B-14B of FIG. 15A.

Referring to FIGS. 15A and 15B, a stacked image sensor semiconductor component 50SIS is illustrated. The stacked image sensor semiconductor component 50SIS includes a base die 130, and two image sensor semiconductor components 50IS stacked on the base die 130. The base die 130 can include integrated circuits, in logic, memory or application specific configurations. The base die 130 also includes plated openings 102SIS in electrical communication with the integrated circuits and with substrate contacts 18SIS. In addition, the conductive interconnects 44IS on the image sensor semiconductor components 50SIS are bonded to the plated openings 102SIS on the base die 130, substantially as previously described for conductive interconnects 44 (FIG. 15A) and the plated openings 102 (FIG. 15A). In the illustrative embodiment there is one base die 130 and multiple image sensor semiconductor component 50IS. However, it is to be understood that the stacked image sensor semiconductor component 50SIS can include one image sensor semiconductor component 50IS and multiple base dice 130.

The stacked image sensor semiconductor component 50SIS also includes conductive interconnects 44SIS in openings 30SIS bonded to the substrate contacts 18SIS, substantially as previously described for conductive interconnects 44 (FIG. 1G) and openings 30 (FIG. 1G). The conductive interconnects 44SIS allow the stacked image sensor semiconductor component 50SIS to be surface mounted substantially as previously described for semiconductor component 50 (FIG. 9).

Figure 16:
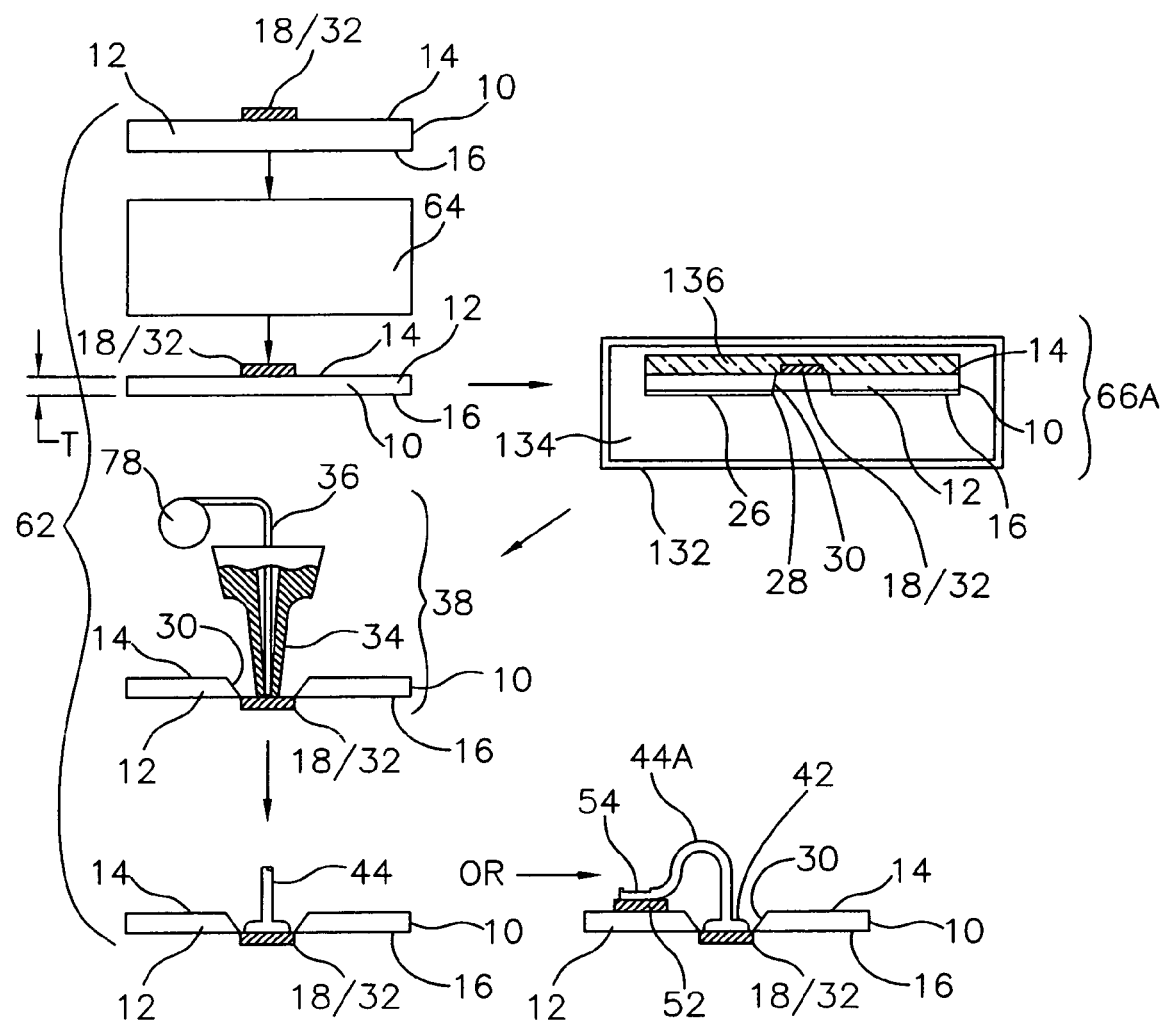
FIG. 16 is a schematic view of a system for performing the method of the invention.

Referring to FIG. 16, a system 62 suitable for performing the method of the invention is illustrated. The system 62 includes the semiconductor wafer 10 containing the semiconductor substrate 12 having the circuit side 14, the backside 16, and the substrate contact 18 on the circuit side 14, substantially as previously described. The system 62 also includes a thinning system 64 configured to thin the semiconductor wafer 10 and the semiconductor substrate 12 from the backside 16 to the selected thickness T. The thinning system 64 can comprise a chemical mechanical planarization or an etching apparatus substantially as previously described. In addition, the thinning system 64 can include these elements in combination or standing alone. For example, the previously described CMP system manufactured by "ACCRETECH" of Tokyo, Japan, has grinding, polishing and etching capabilities.

The system 62 (FIG. 16) also includes a reactive ion etching (RIE) system 66A (FIG. 16) configured to etch the wafer 10 and the semiconductor substrate 12 from the backside 16 to form the substrate opening 30 to the substrate contact 18. The reactive ion etching system (RIE) 66A (FIG. 16) includes a reactive ion etcher (RIE) 132 (FIG. 16) containing an ionized etch gas 134 (FIG. 16) configured to etch the openings 30 in the semiconductor substrate 10, substantially as previously described. One suitable reactive ion etcher (RIE) 132 is manufactured by Applied Materials Inc., Santa Clara, Calif., and is designated a model "DPS II".

During reactive ion etching, the circuit side 14 (FIG. 16) of the semiconductor substrate 12 can be protected by a protective element 136 (FIG. 16) such as a tape material, a deposited polymer layer, or a mechanical element, such as the temporary carrier 15 (FIG. 2A). As with the previous thinning process, the etching process is performed from the backside 16 of the semiconductor substrate 12, with the mask 26 determining which areas on the backside 16 are exposed to the etch gas 134 (FIG. 16). In addition, the size and location of the mask opening 28 (FIG. 16) determines the size and location of the substrate opening 30 (FIG. 16). Further, parameters of the etching process such as the time, the etchant, and the temperature can be controlled to endpoint the substrate opening 30 (FIG. 16) on the inner surface 32 of the substrate contact 18.

Figure 17A:
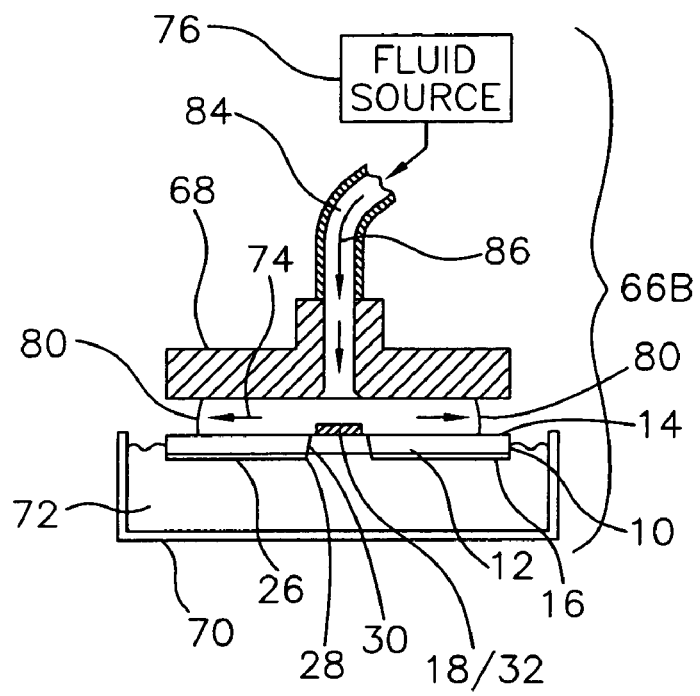
FIG. 17A is a schematic view of an alternate embodiment etching system for the system of FIG. 16.

Alternately, as shown in FIG. 17A, a wet etching system 66B can be used in place of the reactive ion etching system 66A (FIG. 16). The wet etching system 66B (FIG. 17A) includes a Bernoulli holder 68 (FIG. 17A) and a wet bath 70 (FIG. 17A) configured to contain a wet etchant 72 (FIG. 17A). The Bernoulli holder 68 (FIG. 17A) can be constructed using methods and materials that are known in the art. For example, U.S. Pat. No. 6,601,888 entitled "Contactless Handling Of Objects" describes a representative Bernoulli holder. The Bernoulli holder 68 (FIG. 17A) includes an internal passageway 84 in fluid communication with a fluid source 76, such as a gas. The Bernoulli holder 68 (FIG. 17A) is configured to direct a pick up fluid 86 through the passageway 84 and onto the wafer 10 as indicated by arrows 74. This creates a low pressure region 80 (FIG. 17A) for holding the wafer 10 with the backside 16 thereof in contact with the wet etchant 72. In addition, the low pressure region 80 seals the circuit side 14 of the wafer 10 from contact with the wet etchant 72. The Bernoulli holder 68 (FIG. 17A) also includes elements (not shown) such as alignment tabs, which prevent the wafer 10 from moving sideways.

The wet etchant 72 (FIG. 17A) can comprise an anisotropic etchant, such as KOH, configured to etch through the mask opening 28 (FIG. 17A) in the mask 26 (FIG. 17A) on the backside 16 of the wafer 10 to form the substrate opening 30 (FIG. 17A), substantially as previously described. Also as previously described, the etching process can comprise an anisotropic process such that the semiconductor substrate 12 etches along crystal planes at an angle of about 55°. Alternately the etchant can comprise an isotropic etchant, such as TMAH.

Figure 17B:
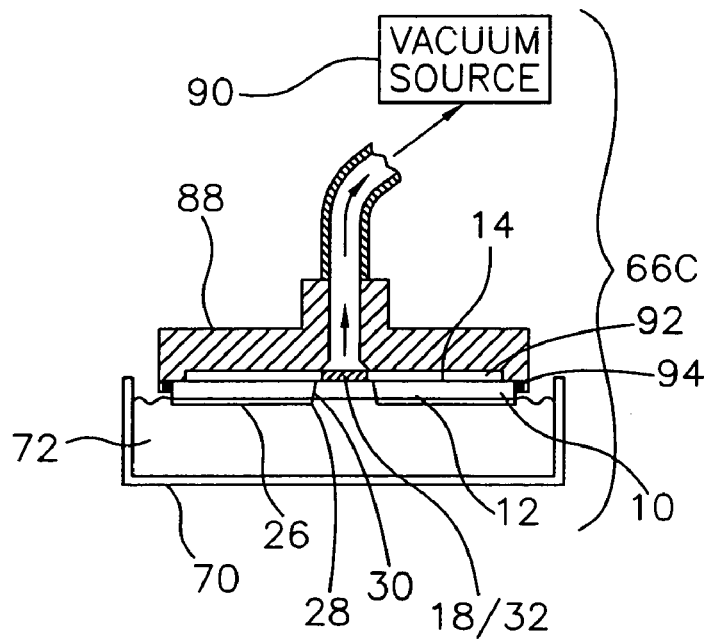
FIG. 17B is a schematic view of an alternate embodiment etching system for the system of FIG. 16.

Referring to FIG. 17B, an alternate embodiment etching system 66C includes a vacuum holder 88 rather than the Bernoulli holder 68 (FIG. 17A). The vacuum holder 88 is in flow communication with a vacuum source 90 configured to create a vacuum force for holding the wafer 10 on the vacuum holder 88. The etching system 66C also includes a polymer gasket 94, which seals the circuit side 14 of the wafer 10 and prevents the wet etchant 72 from contacting the circuit side 14. The polymer gasket 94 can comprise an o-ring or a tape material attached to the outside peripheral edge of the wafer 10. A protective film 92 can optionally be attached to the circuit side 14 of the wafer 10 to further seal the circuit side 14 and provide protection from the wet etchant 72. The protective film 92 can comprise a tape material, or a deposited and cured polymer material, such as a resist, which can be stripped following the etching process.

Referring again to FIG. 16, the system 62 also includes a bonding system in the form of the wire bonder 38 (FIG. 16) having the bonding capillary 34 (FIG. 16) and the wire feed mechanism 78 (FIG. 16), which operate substantially as previously described to form the conductive interconnect 44 (FIG. 16) on the inner surface 32 (FIG. 16) of the substrate contact 18 (FIG. 16) by forming the bonded connection 42 (FIG. 16) and then severing the wire 36 (FIG. 16). Alternately, the wire bonder 38 and the bonding capillary 34 (FIG. 16) can be used substantially as previously described to form the conductive interconnect 44A (FIG. 16) having the bonded connection 42 (FIG. 16) on the inner surface 32 of the substrate contact 18, and the second bonded connection 54 (FIG. 16) on the backside contact 52 (FIG. 16).

As an alternative bonding system, the wire bonder 38 (FIG. 16) and the wire bonding capillary 34 (FIG. 16) in the system 62 (FIG. 16) can be replaced by a tape automated bonding (TAB) system having a bonding tool 71 (FIG. 4B), or a single point TAB bonding tool 71SP (FIG. 5B).

Referring to FIGS. 18A and 18B, a dispensing bumping system 166 for fabricating the conductive interconnects 44LF (FIG. 3J) is illustrated. The dispensing bumping system 166 takes the place of the wire bonder 38 (FIG. 16) in the system 62 (FIG. 16). The dispensing bumping system 166 includes a work holder 168 configured to hold the semiconductor wafer 10 containing the semiconductor substrates 12. In addition, the semiconductor substrates 12 include the pocket sized substrate openings 30A formed from the back sides 16 of the semiconductor substrates 12 to the inner surfaces 32 of the substrate contacts 18, substantially as previously described. In addition, the inner surfaces 32 can include a solder wettable layer or a solder flux, substantially as previously described. As shown in FIG. 18A, the work holder 168 is movable in an x-scan direction, as indicated by scan arrow 174. As shown in FIG. 18B, the work holder 168 is also movable in a y-scan direction, as indicated by scan arrow 176.

The dispensing bumping system 166 also includes a dispensing mechanism 170 in flow communication with a pressure source 178. The dispensing mechanism 170 is a stationary element configured to hold a quantity of solder 172 in a viscous state. Preferably, the solder 172 comprises a lead free solder. The dispensing mechanism 170 includes a head element 180 having a solder slot 182 (FIG. 18B) configured to dispense the solder 172 into the substrate openings 30A as the work holder 168 moves the semiconductor wafer 10 in the scan directions 174, 176. The head element 180 and the solder slot 182 (FIG. 18B) are also configured to planarize the solder 172 in the substrate openings 30A, such that the conductive interconnects 44LF are substantially co-planar with the back sides 16 of the semiconductor substrates 12, substantially as shown in FIG. 3J.

Components of the dispensing bumping system 166, other than the semiconductor wafer 10, are commercially available from IBM (International Business Machines) of East Fishkill, N.Y. and SUSS MicroTec AG of Munchen, Germany. These components are marketed as "Technology for lead-free wafer bumping" under the trademark "C4NP".

Referring to FIG. 19, a template bumping system 184 for fabricating bumped conductive interconnects 44LFB is illustrated. The template bumping system 184 takes the place of the wire bonder 38 (FIG. 16) in the system 62 (FIG. 16). The template bumping system 184 includes a work holder 192 configured to hold the semiconductor wafer 10 containing the semiconductor substrates 12. In addition, the semiconductor substrates 12 include the pocket sized substrate openings 30A formed from the back sides 16 of the semiconductor substrates 12 to the inner surfaces 32 of the substrate contacts 18, substantially as previously described.

The template bumping system 184 also includes a bump template 186 having cavities 188 configured to hold solder 172. The cavities 188 correspond in size, shape and location to the substrate openings 30A in the semiconductor substrates 12 on the wafer 10. The template bumping system 184 also includes the dispensing mechanism 170 (FIG. 18A) configured to dispense the solder 172 into the cavities 188, substantially as previously described for forming the conductive interconnects 44LF (FIG. 18A).

In addition, the template bumping system 184 includes flux and alignment components 196 configured to apply flux to inner surfaces 32 of the substrate contacts 18, and to align the cavities 188 to the substrate openings 30A. The template bumping system 184 also includes clamping 190 and reflow components 198 configured to clamp the bump template 186 to the wafer 10, and to transfer the solder 172 in the cavities 188 into the substrate openings 30A. The template bumping system 184 also includes separation component 200 configured to separate the bump template 186 from the wafer 10, leaving the bumped conductive interconnects 44LFB in the substrate openings 30A. The bumped conductive interconnects 44LFB are substantially similar to the conductive interconnects 44LF (FIG. 3J), but have a generally hemispherical or domed surface rather than a planar surface. In addition, the bumped conductive interconnects 44LFB can comprise a lead free solder substantially as previously described.

As with the dispensing bumping system 166, components of the template bumping system 184, other than the semiconductor wafer 10, are commercially available from IBM (International Business Machines) of East Fishkill, N.Y. and SUSS MicroTec AG of Munchen, Germany. These components are marketed as "Technology for lead-free wafer bumping" under the trademark "C4NP".

Thus the invention provides a method and a system for fabricating semiconductor components, and improved semiconductor components as well. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
   providing a semiconductor substrate having a circuit side, a backside, and a substrate contact on the circuit side having an inner surface;
   forming an opening from the backside to the inner surface of the substrate contact; and
   forming a conductive interconnect comprising a wire from the backside through the opening to the substrate contact having a bonded connection with the inner surface of the substrate contact using a bonding capillary placed in the opening and operated to form the bonded connection; and forming a dielectric encapsulant on the backside encapsulating at least a portion of the conductive interconnect.

2. The method of claim 1 further comprising thinning the substrate from the backside prior to the forming the conductive interconnect step.

3. The method of claim 1 wherein the forming the conductive interconnect step further comprises forming a second bonded connection on a second substrate contact on the backside of the substrate using the bonding capillary.

4. The method of claim 1 further comprising bonding the conductive interconnect to a second substrate contact on the backside of the substrate.

5. The method of claim 1 further comprising stacking a second substrate on the substrate having a second substrate contact bonded to the conductive interconnect.

6. The method of claim 1 further comprising forming a first bump on the inner surface of the substrate contact and wherein the forming the conductive interconnect step bonds the conductive interconnect to the first bump.

7. The method of claim 1 wherein the conductive interconnect projects from the backside with a selected length.

8. The method of claim 1 wherein the substrate comprises a plurality of substrate contacts and the opening encircles the substrate contacts.

9. A method for fabricating a semiconductor component comprising:
   providing a semiconductor substrate having a circuit side, a backside, a first contact on the circuit side having an inner surface, and a second contact on the backside;
   forming a substrate opening in the semiconductor substrate from the backside to the inner surface of the first contact; and
   forming a conductive interconnect from the back side on the inner surface of the first contact and on the second contact using a bonding capillary, the conductive interconnect comprising a wire having a first bonded connection on the inner surface and a second bonded connection on the second contact and forming a dielectric encapsulant on the backside encapsulating at least a portion of the conductive interconnect.

10. The method of claim 9 further comprising forming a terminal contact on the backside in electrical communication with the second contact.

11. A method for fabricating a semiconductor component comprising:
    providing a semiconductor substrate having a circuit side, a backside, a first contact on the circuit side having an inner surface, and a second contact on the backside;
    forming a substrate opening in the semiconductor substrate from the backside to the inner surface of the first contact; and
    forming a conductive interconnect from the back side on the inner surface of the first contact and on the second contact, the conductive interconnect comprising a wire having a first bonded connection on the inner surface and a second bonded connection on the second contact, the first bonded connection comprising a ball bond and the second bonded connection comprising a wedge bond; and forming a dielectric encapsulant on the backside encapsulating at least a portion of the conductive interconnect.

12. A method for fabricating a stacked semiconductor component comprising:
    providing a first semiconductor component having a circuit side, a backside, a contact on the circuit side having an inner surface, and an opening extending from the circuit side to the backside;
    forming a conductive interconnect on the first semiconductor component using a bonding capillary, the conductive interconnect comprising a wire in the opening having a bonded connection on the inner surface of the contact; and
    bonding a second semiconductor component to the first semiconductor component by forming a second bonded connection between the conductive interconnect and a second substrate contact on the second semiconductor component; and forming a dielectric encapsulant on the backside encapsulating at least a portion of the conductive interconnect.

13. The method of claim 12 wherein the wire projects from the opening with a selected length and the second semiconductor component includes a plated opening configured to receive the wire.

14. The method of claim 12 wherein the first semiconductor component comprises a semiconductor die and the second semiconductor component comprises a support substrate.

15. The method of claim 12 wherein the first semiconductor component and the second semiconductor component comprise semiconductor dice.

16. The method of claim 12 wherein the bonded connection comprises a wire bond.

17. The method of claim 12 further comprising forming an underfill layer between the first semiconductor component and the second semiconductor component substantially encapsulating the conductive interconnect.

18. The method of claim 12 wherein the first semiconductor component comprises an image sensor semiconductor component.

19. The method of claim 12 wherein the first semiconductor component comprises an image sensor semiconductor component and the second semiconductor component comprises a semiconductor die.

20. A method for fabricating a semiconductor component comprising:

providing a bonding capillary configured to wire bond a wire;

providing a semiconductor substrate having a circuit side, a backside, an integrated circuit, and a substrate contact on the circuit side in electrical communication with the integrated circuit having an inner surface;

forming an opening in the semiconductor substrate from the backside to the inner surface of the substrate contact; and forming a conductive interconnect in the opening using the bonding capillary, the conductive interconnect comprising the wire and a bonded connection between the wire and the inner surface; and forming a dielectric encapsulant on the backside encapsulating at least a portion of the conductive interconnect.

21. The method of claim 20 further comprising bonding a second semiconductor substrate having a second conductive interconnect bonded to the conductive interconnect.

22. The method of claim 21 further comprising forming a dielectric layer between the first semiconductor component and the second semiconductor component.

23. The method of claim 20 further comprising forming a conductor on the backside in electrical communication with the wire, and a terminal contact on the backside in electrical communication with the conductor.

* * * * *

UNITED STATES PATENT AND TRADEMARK OFFICE
CERTIFICATE OF CORRECTION

PATENT NO. : 7,393,770 B2  Page 1 of 1
APPLICATION NO. : 11/133085
DATED : July 1, 2008
INVENTOR(S) : Wood et al.

It is certified that error appears in the above-identified patent and that said Letters Patent is hereby corrected as shown below:

In column 22, line 26, in Claim 9, after "contact" insert -- ; --.

Signed and Sealed this

Second Day of September, 2008

JON W. DUDAS
*Director of the United States Patent and Trademark Office*